US007005351B2

(12) United States Patent
Henninger et al.

(10) Patent No.: US 7,005,351 B2
(45) Date of Patent: Feb. 28, 2006

(54) METHOD FOR FABRICATING A TRANSISTOR CONFIGURATION INCLUDING TRENCH TRANSISTOR CELLS HAVING A FIELD ELECTRODE, TRENCH TRANSISTOR, AND TRENCH CONFIGURATION

(75) Inventors: Ralf Henninger, München (DE); Franz Hirler, Isen (DE); Joachim Krumrey, München (DE); Walter Rieger, Arnoldstein (AT); Martin Pölzl, Ossiach (AT); Heimo Hofer, Fuernitz (AT)

(73) Assignee: Infineon Technologies AG, Munich (DE)

( * ) Notice: Subject to any disclaimer, the term of this patent is extended or adjusted under 35 U.S.C. 154(b) by 284 days.

(21) Appl. No.: 10/392,024

(22) Filed: Mar. 19, 2003

(65) Prior Publication Data

US 2004/0031987 A1 Feb. 19, 2004

(30) Foreign Application Priority Data

Mar. 19, 2002 (DE) ........................................ 102 12 148
Jul. 31, 2002 (DE) ........................................ 102 34 996

(51) Int. Cl.
*H01L 21/336* (2006.01)

(52) U.S. Cl. ........................................ 438/268; 438/270

(58) Field of Classification Search ................. 438/212, 438/259, 268, 270, 271; 257/302, 328, 329, 257/330, 332
See application file for complete search history.

(56) References Cited

U.S. PATENT DOCUMENTS

| | | | | |
|---|---|---|---|---|
| 5,283,201 | A | 2/1994 | Tsang et al. | |
| 5,801,417 | A | 9/1998 | Tsang et al. | |
| 5,998,833 | A | 12/1999 | Baliga | |
| 6,051,468 | A | 4/2000 | Hshieh | |
| 6,191,447 | B1 | 2/2001 | Baliga | |
| 6,198,127 | B1 | 3/2001 | Kocon | |
| 6,291,298 | B1 * | 9/2001 | Williams et al. | 438/270 |

FOREIGN PATENT DOCUMENTS

| | | | |
|---|---|---|---|
| DE | 100 38 177 | A1 | 2/2002 |
| EP | 1 170 803 | A2 | 1/2002 |
| WO | 97/00536 | | 1/1997 |
| WO | 01/71817 | A2 | 9/2001 |

* cited by examiner

*Primary Examiner*—Hoai Pham
(74) *Attorney, Agent, or Firm*—Laurence A. Grenberg; Werner H. Stemer; Gregory L. Mayback

(57) ABSTRACT

A method for fabricating a transistor configuration including at least one trench transistor cell has a gate electrode and a field electrode disposed in a trench below the gate electrode. The trenches are formed in a semiconductor substrate. A drift zone, a channel zone, and a source zone are in each case provided in the semiconductor substrate. According to the invention, the source zone and/or the channel zone are formed at the earliest after the introduction of the trenches into the semiconductor substrate by implantation and diffusion.

28 Claims, 20 Drawing Sheets

METHOD FOR FABRICATING A TRANSISTOR CONFIGURATION INCLUDING TRENCH TRANSISTOR CELLS HAVING A FIELD ELECTRODE, TRENCH TRANSISTOR, AND TRENCH CONFIGURATION

BACKGROUND OF THE INVENTION

Field of the Invention

The present invention relates to a method for fabricating a transistor configuration including at least one trench transistor cell having a field electrode, in which at least one trench is introduced into a process layer of a semiconductor substrate, a field electrode and a gate electrode are provided in the trench in a manner electrically insulated in each case from one another and from the process layer, and at least in each case one drift zone, one channel zone, and one source zone are formed in the process layer.

Present-day customary trench MOS power transistors (UMOSFET, u-shaped metal oxide semiconductor field effect transistor) are distinguished from older types of MOS power transistors (DMOSFET, double diffused MOSFET, VMOSFET, v-shaped MOSFET) by a very low on resistivity ($r_{DS,\ on}$)

In this case, the gate electrode of a trench transistor cell is disposed in a trench in the semiconductor substrate. The source and drain zones of the trench transistor cell are formed in mutually opposite regions of the semiconductor substrate. A channel path controlled by the gate electrode then extends in a vertical direction through the semiconductor substrate. As a result, the on resistance is significantly reduced by a significant increase in the channel width per unit area.

A further improvement of the properties of trench MOS power transistors is achieved by disposing a field electrode in the trench. In this case, the gate electrode and field electrode are disposed in the trench in such a way that the gate electrode is opposite the channel zone and the field electrode is essentially opposite a drift path adjoining the channel zone. The field electrode shields the gate electrode from the drain zone, as a result of which, the gate-drain capacitance is greatly reduced or, in the event of the field electrode being connected to the source potential, is converted into a less critical gate-source capacitance.

FIG. 2 illustrates the basic construction of a trench transistor cell of conventional trench MOS power transistors (UMOSFFT). A semiconductor substrate of a trench MOS power transistor includes an $n^{++}$-doped basic substrate 1 and also an n-doped process layer 2 that is generally grown epitaxially on the basic substrate 1. The basic substrate 1 forms a drain zone 10. The process layer (epitaxial layer hereinafter) 2 has, adjoining the basic substrate 1, an $n^{++}$-doped drift zone 21, adjoining the latter a p-doped channel zone 22 and, between the channel zone 22 and the substrate surface 20 opposite to the basic substrate 1, an $n^{++}$-doped source zone 23. Disposed in the epitaxial layer 2 are trenches 6, which can reach right into the basic substrate. Disposed within the trenches 6, there are in each case a field electrode 63, approximately opposite the drift zone 21, and a gate electrode 62, approximately opposite the channel zone 22. The field electrode 63 is electrically insulated from the epitaxial layer 2 by a first dielectric layer (field plate) 321. The gate electrode 62 is insulated from the epitaxial layer 2 by the gate dielectric layer (gate oxide) 33 and from the field electrode 63 by a second dielectric layer 322. The source zone 23 and usually the channel zone 22 are connected to the source terminal of the trench MOS power transistor. The drain zone 10 is connected to the drain terminal and the gate electrode 62 is connected to the gate terminal.

The trenches 6 may be formed as strips, as lattices, or in the form of other polygons, thereby producing strip-type or honeycomb-type trench transistor cells.

The trench MOS power transistor illustrated in FIG. 2 is of the n-channel MOS transistor type for enhancement mode operation. In this case, with dopings changed accordingly, the construction can also be applied to the other three customary embodiments (p-channel, depletion-mode operation) of MOS transistors.

In the case of the trench MOS power transistor illustrated in FIG. 2 the current between the source terminal and the drain terminal is controlled by a potential $U_{GS}$ between the gate terminal and the source terminal. If UGS≦0, then no current flows between source and drain since the channel zone 22 blocks a charge carrier transport. If a positive voltage is applied to the gate electrode 62 in the trench, then minority carriers accumulate in the p-doped channel zone 22 (electrons) in a thin layer along the gate oxide 33 opposite the gate electrode 62. This n-conducting channel 221 (inversion layer) forms a conductive junction between the source zone 23 and the drift zone 21 whose extent into the channel zone depends on the magnitude of the potential applied to the gate electrode 62. The field electrode 63, which is in this case connected to the source terminal, prevents a capacitive coupling of the gate electrode 62 to the drain zone 10 or the drift zone 21. A gate-drain capacitance $C_{GD}$ is thereby transformed into a gate-source capacitance $C_{GS}$ and a drain-source capacitance $C_{DS}$ whose respective influence on switching losses of the trench MOS power transistor is significantly smaller.

In the optimization of the fashioning of trench MOS power transistors, what are of importance, beside a low gate-drain capacitance, are a connection of the gate electrodes that has the lowest possible resistance, a uniform thickness of the gate dielectric layer, and continuous junctions of dielectric layers, in particular at corners and edges of the relief.

A method for fabricating a trench transistor configuartion having two gate polysilicon regions is described in U.S. Pat. No. 5,283,201 issued to Tsang et al. A further method is disclosed in U.S. Pat. No. 5,801,417 issued to Tsang et al. In both methods, trenches are introduced into a semiconductor substrate in which doped layers for a source zone and a channel zone have already been fashioned.

A further prior-art method for fabricating a UMOS trench transistor is disclosed in U.S. Pat. No. 5,998,833 to Baliga. The method described therein is illustrated diagrammatically in FIG. 3 in the nine substeps 3*a* to 3*i*. In this case, subfigures 3A to 3I each show a diagrammatic cross section through the region of two trench transistor cells fashioned in strip form. They are trench transistor cells of the n-channel type with enhancement-mode behavior.

As is illustrated in FIG. 3A, an epitaxial layer 2 is grown on a heavily $n^{++}$-doped basic substrate 1. The epitaxial layer 2 is n-doped in situ during the growth process.

In two successive steps, in each case with the aid of implantation masks, proceeding from a substrate surface 20 of the epitaxial layer 2 that is opposite to the basic substrate 1, dopants are then implanted into the epitaxial layer 2 and outdiffused.

What are produced are in each case a source zone 23—layered horizontally with respect to the substrate surface 20—below the substrate surface 20 and a channel zone 22 below the source zone 23. Between the channel zone 22 and the basic substrate 1, the remaining portion of the epitaxial layer 2 forms a drift zone 21.

A hard mask 30 is subsequently deposited on the substrate surface 20. In this case, the hard mask 30 includes an oxide layer 301 and an oxidation barrier 302. The hard mask 30 is patterned using customary methods of semiconductor process technology. In this case, sections of the substrate surface are uncovered in openings 61 of the hard mask. The structure illustrated in FIG. 3C is produced.

In the subsequent method step, the epitaxial layer 2 is etched in the region of the openings 61 of the hard mask 30. Trenches 6 are produced, which extend through the source zone 23, the channel zone 22 and, at least in sections, also through the drift zone 21. In this case, the trenches 6 may form a plurality of trenches running parallel one beside the other or form a lattice structure from trenches running perpendicularly or transversely with respect thereto in a cross-sectional plane that is not illustrated. Afterward, for example by thermal oxidation of the epitaxial layer 2 and masking by the oxidation barrier 302, a first dielectric layer 321 (oxide layer hereinafter) is formed, which lines the inside of the trenches.

The result of this method step is illustrated in FIG. 3D.

Doped polycrystalline silicon (polysilicon) is thereupon deposited on the structure thus formed. In this case, the thickness of the deposited layer is at least as large as half the open trench width. The polysilicon is then etched back to an extent such that it fills the trenches 6 only as far as approximately a body height 72 defined by the channel zone/drift zone junction 71. The field electrode 62 thus produced is illustrated in FIG. 3E.

The oxide layer 321 is then etched; the oxidation barrier 302, usually silicon nitride, and the polysilicon of the field electrode 62 serve as etching masks. This removes the oxide layer 321 above the field electrodes 62 from the trench wall. The result of this etching step is illustrated in FIG. 3F.

A second dielectric layer 323 is then produced at the uncovered sections of the trench walls, for example once again by thermal oxidation, which second dielectric layer also extends over the surface of the polysilicon of the field electrode 63. The second dielectric layer thus produced forms a gate oxide 33 in sections. In the next step, polycrystalline silicon is once again deposited on the surface of the structure and subsequently etched back until it fills the trenches 6 approximately as far as substrate surface 20.

As is illustrated in FIG. 3G, the gate electrode 62 is formed above the field electrodes 63 in the trenches 6 in this way. Afterward, the uncovered polysilicon of the gate electrodes is thermally oxidized, so that the trenches 6 are covered with a third dielectric layer 323.

The hard mask 30 is subsequently removed by etching.

As is illustrated in FIG. 3H, the $n^{++}$-doped source zone 23 is uncovered on the substrate surface 20. The gate electrodes 62 are in each case insulated toward the substrate surface by the dielectric layer 323.

As the process progresses further, a source terminal metallization 53, which makes contact with the source zones 23, can then be applied on the top side of the semiconductor body. A drain metallization 51, which makes contact with the drain zone 10, is applied on the rear side of the semiconductor substrate.

FIG. 3I illustrates trench transistor cells in cross section as emerge from the method according to U.S. Pat. No. 5,998,833.

What is disadvantageous about the known methods for fabricating a trench MOS power transistor having gate and field electrodes disposed in trenches is, inter alia, the fact that, as a result of the early doping of channel and source zones, subsequent process steps influence the formation of the doped zones and the variability of subsequent process steps is restricted in favor the stability of the structure of channel and source zones. Thus, for instance, transistor configurations constructed for low operating voltages have very short channel lengths and a correspondingly low on resistance $R_{DS(on)}$. In the case of such transistor configurations, even slight subsequent influences on the fashioning of the channel zone lead to a disadvantageous increase in the on resistance $R_{DS(on)}$. A permissible thermal budget for manufacturing steps to be performed after the fashioning of the channel zone is then very small.

Furthermore, for instance when forming the gate oxide by thermal oxidation at the trench inner surfaces with a hard mask which at the same time bears on the substrate surface, on account of different expansion coefficients of the material or materials of the hard mask and of the substrate, thermomechanical stresses arise in regions of the substrate adjacent to the hard mask. The stresses result in a thinning of the gate oxide produced by thermal oxidation in the regions adjacent to the hard mask, and thus in a reduction of the dielectric strength of the gate oxide in the regions of the gate oxide adjoining the hard mask.

Without further measures, it is subsequently not possible to lead the gate electrode past over the substrate surface at the regions of reduced dielectric strength to the source zone without losses in the specification for the dielectric strength of the transistor configuration.

SUMMARY OF THE INVENTION

Therefore, it is an object of the invention to provide a method for fabricating a transistor configuration including trench transistor cells having a field electrode, a trench transistor, and a trench configuration, in which the variability of the available process steps is increased compared with known methods and/or the formation of channel and source zones is largely independent of subsequent process steps. In this case, the intention is to enable the gate electrode and/or the field electrode to be led from the trenches over the substrate surface without losses in the dielectric strength of the transistor configuration, and the intention is to provide a trench transistor cell and a transistor configuration having a low gate-source capacitance and a high gate-source breakdown voltage.

With the foregoing and other objects in view, there is provided, in accordance with the invention, a method for fabricating a transistor configuration having a trench transistor cell. The first step of the method is introducing a trench into a process layer of a semiconductor substrate. The next step is providing a field electrode and a gate electrode in the trench. The next step is electrically insulating the field electrode and the gate electrode from one another and from the process layer. The next step is forming, at least in each case, a drift zone, a channel zone, and a source zone in the process layer. At least one of the source zone and the channel zone are formed after the introducing of the trench into the semiconductor substrate.

With the objects of the invention in view, there is also provided a trench transistor cell in a substrate including a semiconductor substrate, a drain zone, a drift zone, a channel zone, a source zone, a first dielectric layer, a gate oxide, a field electrode, a gate electrode, and a second oxide layer.

The semiconductor substrate has a substrate surface and a trench formed therein. The trench has a trench bottom. The drain zone, the drift zone, the channel zone, and the source zone are formed in the semiconductor substrate in each case successively and in essentially horizontally layered fashion. The drift zone and the channel zone join opposite a body height in the semiconductor substrate. The first dielectric layer has an upper edge and lining the trench as far as essentially the body height. The gate oxide is disposed between the body height and the substrate surface (20) and has a thinnest point. The field electrode is disposed in the trench and extends essentially from the trench bottom as far as the upper edge of the first dielectric layer. The gate electrode is disposed in the trench between about the body height and the substrate surface. The second oxide layer is disposed in the trench between the gate electrode and the field electrode. The second oxide layer, at every point between the field electrode and the gate electrode, is at least as thick as the thinnest point of the gate oxide.

With the objects of the invention in view, there is also provided a transistor configuration having a trench transistor as described in the previous paragraph.

Thus, in accordance with the method according to the invention, at least the source zone or the channel zone of trench transistor cells of a transistor configuration is formed at the earliest after an introduction of trenches into a semiconductor substrate by implantation and activation or diffusion. This obviates any influencing of the source and channel structures by the preceding process steps. The thermal loading to which the doped source or channel zone is exposed is significantly reduced. The variability of the process steps preceding the fashioning of the source or channel zones is increased because the thermal loading implied thereby is no longer restricted by taking account of the doped structures. Furthermore, because all the process steps preceding the formation of the doped zones do not enter into the thermal budget thereof, the permissible share of subsequent process steps in the permissible thermal budget of the doped structures increases and the variability of subsequent process steps thus increases in turn.

The method according to the invention thus includes providing a semiconductor substrate, including a highly doped basic substrate, which at the same time forms a drain zone, and also a process layer disposed on the basic substrate, whose surface opposite to the basic substrate forms a substrate surface. Trenches are subsequently introduced in the process layer from the substrate surface. Afterward, the trenches are lined with a first dielectric layer that is disposed, at least in sections, on the inner surfaces (trench wall) oriented toward the inside of the trench. In this case, the trench is lined from a trench bottom as far as a body height at which a drift zone/channel zone junction is provided in the finished semiconductor substrate. Besides this well-like configuration of the first dielectric layer in the lower trench region, a complete lining of the trenches with the first dielectric layer or else a configuration of the first dielectric layer at least in sections on the substrate surface is also possible at this point in the method. In a further method step, a field electrode made of an electrically conductive material is disposed in the lower trench region, which extends from the bottom of a trench as far as the body height. If the conductive material of the field electrode is highly doped polysilicon, for example, then the configuration of the field electrode is effected by deposition of polysilicon in the trenches and on the substrate surface with a layer thickness that is greater than half the open trench width. The material is thereupon made to recede in an etching step. The etching step is terminated as soon as the conductive material fills the trenches only as far as approximately the body height, that is to say the later drift zone/channel zone junction. Afterward, in those regions of the trenches which are not filled by the conductive material of the field electrode, a gate dielectric layer is produced at the trench walls, which gate dielectric layer, in the finished semiconductor substrate, electrically insulates the gate electrode disposed in the trench from the channel zone disposed in the semiconductor substrate.

The doping of the process layer is weak compared with that of the basic substrate. Such a weakly or lightly doped layer can be fabricated for example in a known manner by an epitaxial method. Hereinafter, the lightly doped process layer is also referred to as epitaxial layer independently of its fabrication method, as is generally customary in connection with power transistors. However, this is not intended in anyway hereinafter to restrict a process for fabricating the process layer to epitaxial methods.

If the first dielectric layer is also disposed at the trench walls of the upper trench region extending between the body height and the substrate surface (silicon edge), the thickness of which first dielectric layer is generally significantly greater than the thickness of the gate dielectric layer, then the gate dielectric layer can be fashioned by etching back the first dielectric layer.

If the first dielectric layer is completely removed in the upper trench region, then the gate dielectric layer can be provided at the trench wall in the upper trench region by thermal oxidation or by deposition (gate oxide hereinafter). Generally, at the same time as the formation of the gate oxide, a further dielectric layer is also fashioned as an oxide layer on the surface of the field electrode.

Particularly in the case of transistor configuration having trench transistor cells in which the field electrode is connected to the source potential, the configuration of the dielectric layer which electrically insulates the field electrode from the gate electrode disposed above and/or beside the latter is gaining importance. The configuration formed from the gate electrode, the field electrode, and the dielectric layer situated in between determines the gate-source capacitance of the transistor configuration. Through the significant reduction of the gate-drain capacitance $C_{GD}$, a reduction of the gate-source capacitance gains importance if the product of gate charge and on resistivity of the transistor configuration (figure of merit, FOM) is to be reduced further. Furthermore, the dielectric isolation between the gate electrode and the field electrode must have at least a quality which allows a breakdown between the gate electrode and a field electrode connected to the source potential to become less likely than a breakdown between the gate electrode and the drain electrode.

According to a particularly preferred embodiment of the method according to the invention, the second dielectric layer and the gate dielectric layer are in each case provided as oxide layers. In this case, the fashioning of the two oxide layers includes at least one process step, during which, the two oxide layers grow simultaneously but at different rates. Therefore, the second dielectric layer thus produced on the field electrode (second oxide layer) has, at its thinnest point, a layer thickness that is approximately at least 5% higher than the thinnest point of the gate dielectric layer produced (gate oxide).

Such a difference in the layer thickness of gate oxide and oxide layer on the field electrode can be brought about for example by an oxidation process in which the supply of oxygen is reduced compared with customary oxidation methods and the oxidation duration at a final temperature of the oxidation process is lengthened.

A reduction of the gate-source capacitance requires a higher layer thickness of the dielectric layer between the gate electrode and the field electrode connected to source potential. On the other hand, however, the layer thickness of the gate dielectric layer is prescribed functionally, that is to say cannot be increased arbitrarily. The method according to the invention makes it possible, in a simple manner, for example without additional masking steps, to form the gate dielectric layer and the dielectric layer on the field electrode simultaneously in a common process step and, in so doing, to satisfy the contrasting requirements made of the two layers with regard to the layer thickness.

According to a first embodiment of the way in which the invention forms the gate oxide and the oxide layer on the field electrode, a plasma oxide layer is deposited by an HDP (high density plasma) process on the field electrode. Such a deposition takes place most predominantly on planar areas. An oxide layer can thus be deposited selectively with respect to the trench wall on the field electrode and the first dielectric layer surrounding the field electrode, as a result of which a pronounced difference between the layer thickness of the gate oxide and the layer thickness of the oxide layer on the field electrode can be produced in a particularly simple manner.

A second advantageous embodiment of such a method for forming the gate oxide and the second oxide layer on the field electrode is effected by a diffusion-limited deposition of silicon oxide by tetraethyl orthosilane (TEOS). During a diffusion-limited deposition, silicon oxide preferably grows on horizontal areas. On the vertical trench walls, the silicon oxide grows at a decreasing rate toward the trench bottom, so that the layer thickness of a gate oxide produced in this way decreases in the direction of the trench bottom. However, no difference results in the layer thickness of the gate oxide compared with the layer thickness of the oxide layer on the field electrode. However, it is ensured in this way that the thinnest point of the oxide layer on the field electrode is not thinner than the thinnest point of the gate oxide. With the use of TEOS, it is possible to achieve identical layer thicknesses in the region of the gate oxide and of the oxide layer on the field electrode with just one common unmasked process step.

According to a further variant of the preferred embodiment of the method according to the invention, a moist oxidation relative both to the trench wall and to the surface of the field electrode is effected. For the moist oxidation, both oxygen and hydrogen are supplied during the oxidation process. The presence of hydrogen leads to significantly different oxidation rates for the highly doped polysilicon of the field electrode on the one hand, and, for instance, a crystalline silicon of the channel zone—forming the trench wall—of the semiconductor substrate, on the other hand. In this case, the proportion of hydrogen is dimensioned to achieve a significant difference in layer thickness between the gate oxide and the oxide layer on the field electrode. Since the presence of hydrogen generally accelerates the oxidation process, the moist oxidation is effected at a reduced temperature—compared with a customary dry oxidation—of between five-hundred degrees Celsius and one-thousand degrees Celsius (500° C.–1000° C.). The reduced oxidation temperature slows down a growth of the oxidation layers to an extent such that the layer thickness of the gate oxide can be realized reliably within the specified tolerance variation. In this way, it is advantageously possible to achieve differences in layer thickness between the gate oxide and the oxide layer on the field electrode of around approximately one-hundred percent (~100%). The moist oxidation can also be combined with a preceding HDP process.

A further advantage of moist oxidation is the reduced fashioning of thin points of oxide at the edges of the oxide layers formed. Thin points of oxide arise if, on account of different thermal expansion coefficients of two adjacent materials, mechanical stresses build up in the materials in the region of the interfaces thereof.

The mechanical stresses locally reduce the oxidation rate, so that, at such points, thinning occurs in layers growing there.

Preferably, a process in which the gate oxide and the oxide layer on the field electrode are fashioned with different thicknesses is followed by a dry oxidation process. This dry oxidation process is effected at a process temperature at which the oxide layers formed begin to flow viscously, as a result of which thin oxide points at corners and edges are thickened or compensated for. The required process temperature is dependent on further process parameters and is usually more than one-thousand degrees Celsius (>1000° C.). If such a dry oxidation process follows a moist oxidation process, then seventy-five percent (75%), for example, of the gate oxide thickness is grown in moist fashion and the remaining twenty-five percent (25%) in dry fashion.

Furthermore, the dry oxidation process improves the quality of the silicon/silicon oxide interface, for instance by reducing the incorporation of charge carriers or the production of open silicon bonds. Thus, the abovementioned combination of moist oxidation and subsequent dry oxidation results, in a particularly advantageous manner, in a simultaneous formation of gate oxide and oxide layer on the field electrode with different layer thicknesses and with thickened thin oxide points. Furthermore, the process enables a further optimization with regard to the gate-source capacitance and the gate-drain capacitance of the transistor configuration since alternative fashionings of the first dielectric layer (field plate) which differ in terms of angle and fabrication process can be realized without losses in the quality of the gate oxide.

The above-described embodiments according to the invention for forming a gate oxide and an oxide layer on the field electrode can therefore also be integrated particularly easily into the method according to the invention for fabricating a transistor configuration having trench transistor cells having a field electrode since the fashioning of channel and source zones by doping only takes place at a later stage and cannot be adversely affected by a thermal stress in the course of the gate oxide formation.

In a further step of the method according to the invention, the gate electrodes are disposed in the trenches. The gate electrodes are electrically insulated from the field electrode and disposed underneath by the second dielectric layer and from the surrounding semiconductor substrate by the gate dielectric layer.

In a particularly preferred manner, both the channel zone and the source zone are formed after the introduction of the trenches into the semiconductor substrate, since then both doped regions are independent of the preceding process steps.

According to a particularly preferred embodiment of the method according to the invention, the channel zone or the source zone or both is or are formed after the configuration of the gate electrodes in the trenches.

This reduces, in particular, the thermal loading on the doped structures by an amount that is applied by the process steps between the introduction of the trenches and the configuration of the gate electrode.

Introducing the dopings after fashioning the gate electrodes is also advantageous since a doping of the semiconductor substrate via the trench wall is suppressed. This results in a homogenous doping and a better controllability of the implantation operation.

According to a further particularly preferred embodiment of the invention, the first dielectric layer is applied after the introduction of the trenches with a layer thickness that is at least a factor of two greater than that of the gate oxide. Afterward, the trenches are filled virtually completely with the material of the field electrode. If the trench transistor cells and thus the trenches are fashioned in strip form, then what is produced in a plan view of the trench filled with the material of the field electrode and the first dielectric layer is a strip-type configuration of the field electrode in the trench center and the first dielectric layer on both sides of the field electrode.

In a subsequent process step, the dielectric layer is removed in the interspace between the epitaxial layer and the field electrode down to a trench depth defined by the channel zone/drift zone junction fashioned later (body height). In the interspaces resulting from the etching back of the first dielectric layer, a second dielectric layer is then formed in each case at least at the uncovered sections of the trench wall and the uncovered surfaces of the field electrode, which second dielectric layer forms the gate oxide at the trench walls. If the second dielectric layer is applied by thermal oxidation, then the dielectric layer is produced exclusively at the trench walls and at the uncovered surface sections of the field electrode.

In the case of a configuration of the second dielectric layer by deposition, the second dielectric layer extends over the trench wall, the uncovered surface sections of the field electrode, and over the etched-back surfaces of the first dielectric layers.

The material of the gate electrode is subsequently introduced into the interspaces between the field electrode and the semiconductor substrate. The interspaces are lined with the dielectric layers in the case of strip-type fashioning of the trenches. This method achieves a formation of the gate and field electrodes disposed in the trench transistor cell in which, in an upper trench region above the body height, a field electrode disposed in the trench center is surrounded by sections of the gate electrode.

According to a further preferred embodiment of the method according to the invention, the lining—in sections—of the trenches with a first dielectric layer includes the following steps.

In a first step, the first dielectric layer is applied, in masked fashion, at least to the trench walls, or in unmasked fashion, to the entire process area including the trench walls and is removed again in masked fashion.

A first auxiliary layer is subsequently applied on the first dielectric layer, the material of the first auxiliary layer completely filling the trenches.

Afterward, parts of the first auxiliary layer are removed again. The trenches remain filled as far as the body height by residual sections of the first auxiliary layer. Subsequently, the dielectric layer, in the sections not covered by the residual sections of the first auxiliary layer, is either removed or has its layer thickness reduced. The gate oxide emerges as a result of reduction of the layer thickness of the first dielectric layer. In subsequent steps, the initially residual sections of the first auxiliary layer are removed again.

Since the first auxiliary layer is completely removed again after the fashioning of the first dielectric layer or the first dielectric layer and the gate oxide, the material of the etching layer can be chosen solely from production engineering standpoints. Through a suitable choice of the material of the first auxiliary layer, it is possible, in a particularly advantageous manner, to produce gradual junctions between the first dielectric layer and the gate oxide. In the case where the first auxiliary layer is realized from a material whose etching properties permit a precise control of the etching operation, the junction between the first dielectric layer and the gate oxide in the trench can be made to correspond, in a particularly advantageous manner to the drift zone/channel zone junction in the semiconductor substrate.

In a preferred manner, before the reduction or the removal of the first dielectric layer in sections not covered by the first auxiliary layer, a second auxiliary layer is disposed in edge regions of trenches in which one of the two electrodes disposed in the trenches is subsequently led over the substrate surface. The second auxiliary layer fills the trenches in edge regions above the body height and covers sections of the substrate surface that adjoin the edge regions of the trenches.

During a subsequent removal or reduction of the first dielectric layer, the first dielectric layer is preserved with the original layer thickness in the regions covered by the second auxiliary layer. This makes it possible subsequently to lead out the gate electrode and/or the field electrode from such trenches that are covered during the removal or the reduction of the first dielectric layer over the substrate surface without losses in the dielectric strength of the transistor configuration.

In a further embodiment of the method according to the invention, after the removal of the residual sections of the auxiliary layer, the trenches are lined completely with the first dielectric layer. The first dielectric layer has a layer thickness $d_o$ in an upper region of the trench facing the substrate surface, and a layer thickness $d_u$ that is greater than $d_o$ in a lower region of the trench.

The field electrode is then introduced by conformal deposition of the material of the field electrode with a layer thickness $d_A$ which is at least half as large as the width of an interspace encompassed by the first dielectric layer in the lower trench region as far as the body height. Through the uniform growth of the material of the field electrode during conformal deposition, the interspace in the lower trench region is completely filled and covered by a layer of the material of the field electrode having a defined thickness. Through subsequent isotropic etching back of the material of the field electrode, the material of the field electrode can then be removed, in a precise and thus advantageous manner, exactly completely from the upper region of the trench.

In an advantageous manner, the material of the auxiliary layer is a photoresist which is subjected to a postbake process before the first dielectric layer is made to recede in sections.

Furthermore, in an advantageous manner, before the application of the auxiliary layer, an adhesion promoter for the material of the auxiliary layer is provided, which is removed again after the introduction of the field electrode.

The fashioning of the gate dielectric layer at sections in the upper region of the trench wall can be effected by deposition or oxidation of the silicon of the semiconductor substrate.

According to a particularly preferred embodiment of the invention, the gate dielectric layer emerges by reducing the layer thickness $d_{ds}$ of the first dielectric layer disposed in these regions to a layer thickness $d_{GD}$. In this case, the layer thickness is reduced in sections of the trench wall that are not covered either by the auxiliary layer or by the field electrode. This embodiment of the method according to the invention includes an additional application of a further dielectric layer on the field electrode.

As an alternative to this, in a further preferred embodiment of the invention, the further dielectric layer on the field electrode may emerge from a process in which the material of the further dielectric layer is also disposed over the reduced first dielectric layer in the upper trench region above the body height. A multilayer gate oxide is produced in this way.

As an alternative to the two preceding embodiments of the invention, the first dielectric layer is completely removed in sections of the trench inner surface that are not covered either by an auxiliary layer or by the field electrode, so that the gate dielectric layer is formed exclusively by sections of a second dielectric layer applied in a subsequent process.

In this case, the first and second dielectric layers can each be realized as thermal oxide, as deposited oxide, as nitride, as oxide-nitride or as a multilayer structure.

According to a further preferred embodiment of the invention, after a reduction of the layer thickness $d_{ds}$ of the first dielectric layer or after the removal of the first dielectric layer in sections not covered by the field electrode, the field electrode is etched back further in an additional step.

In particular, after the removal of the first dielectric layer from the upper region, due to the etching properties of the material of the first dielectric layers, the latter is also etched back in the interspace between the field electrode and the semiconductor substrate. As a result, the field electrode is uncovered in the center of the trench. During a subsequent configuration of the gate electrode, an upper section of the field electrode is surrounded by the gate electrode in a transition region between upper and lower regions of the trench.

This results in an increased capacitance between the gate electrode and the field electrode, which is reduced in a simple and advantageous manner by the method step according to the invention.

The material of the gate electrode or of the field electrode is usually a conductive polysilicon. Conductive polysilicon generally has a relatively high resistivity.

The resistance of the gate electrode or of the field electrode can be reduced by provision of a second material constituent of the gate electrode or field electrode. The further constituent of the material of the gate and/or field electrode is advantageously a metal silicide, which is preferably produced by siliciding the polysilicon.

A trench transistor cell according to the invention is disposed in a semiconductor substrate in which a drain zone, a drift zone, a channel zone and a source zone are fashioned in each case successively and essentially in horizontally layered fashion. Furthermore, a trench is provided in the semiconductor substrate, which trench is lined with a first dielectric layer as far as essentially a body height, which is opposite a junction between drift zone and channel zone in the semiconductor substrate, and with a gate oxide between the body height and the substrate surface. A field electrode extends essentially from the trench bottom as far as the upper edge of the first dielectric layer. The field electrode is adjoined by a gate electrode between approximately the body height and the substrate surface. A second oxide layer is disposed between the gate electrode and the field electrode.

According to the invention, in this case the second oxide layer has, at every point between the field electrode and the gate electrode, at least a layer thickness which corresponds to the layer thickness at the thinnest point of the gate oxide. Transistor configurations such as MOS power transistors and IGBTs can be realized from the trench transistor cell according to the invention.

The method according to the invention and the trench transistor cell according to the invention are illustrated above in connection with n-channel MOS transistors. However, the method according to the invention and also the trench transistor cell according to the invention can also readily be applied to p-channel MOS transistors or IGBTs.

An integration into an IC process of a known type, for instance by using a conductive sinker in the semiconductor substrate, can also be implemented in a manner that is obvious to the person skilled in the art.

Other features that are considered as characteristic for the invention are set forth in the appended claims.

Although the invention is illustrated and described herein as embodied in a method for fabricating a transistor configuration including trench transistor cells having a field electrode, a trench transistor, and a trench configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
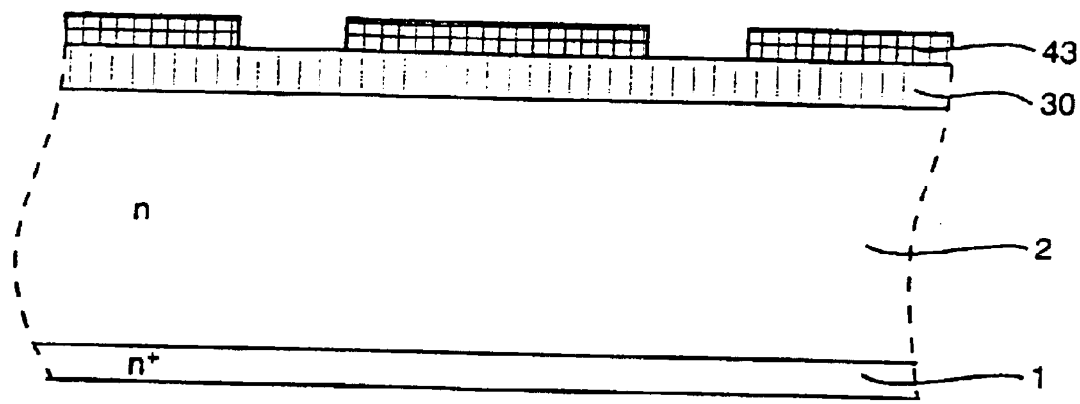
FIGS. 1A–1N are diagrammatic, partial sectional views showing a sequence of method steps of a first embodiment according to the invention for fabricating a transistor.
Figure 1B:
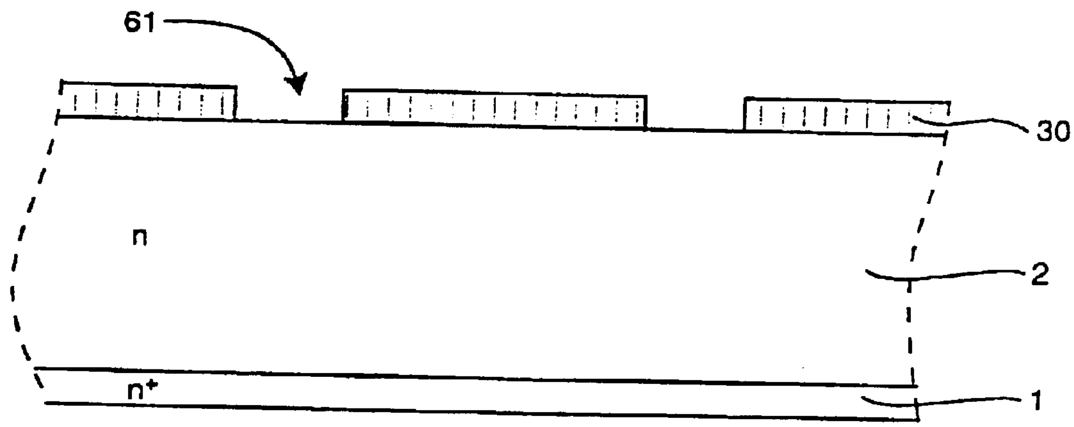
Figure 1C:
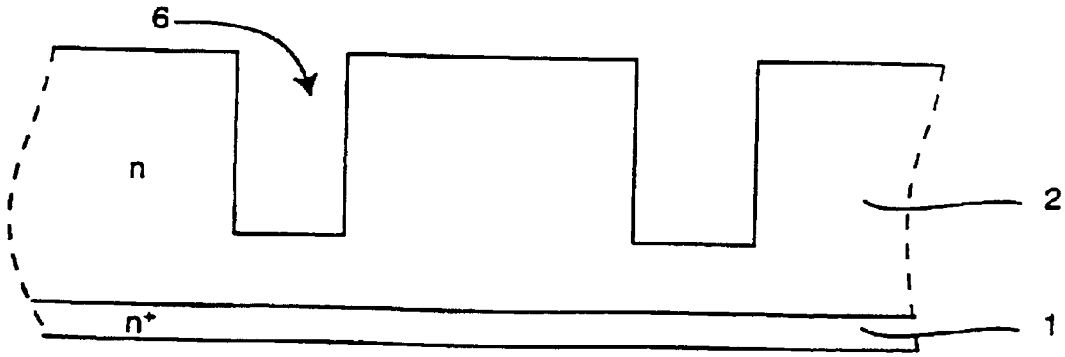
Figure 1D:
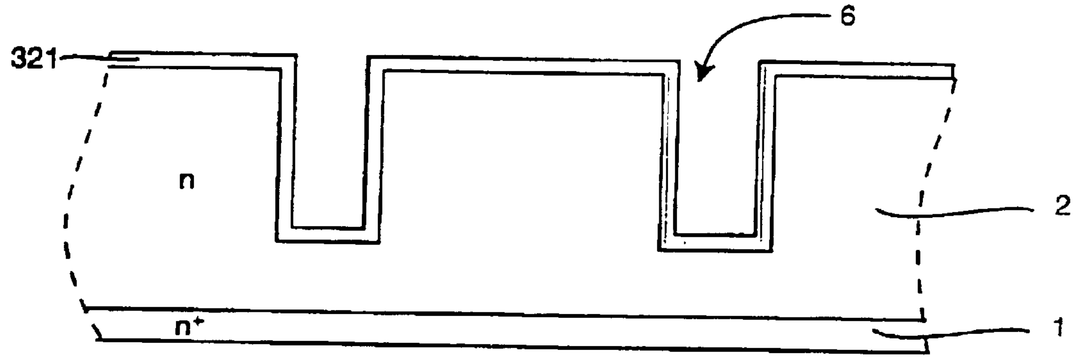
Figure 1E:
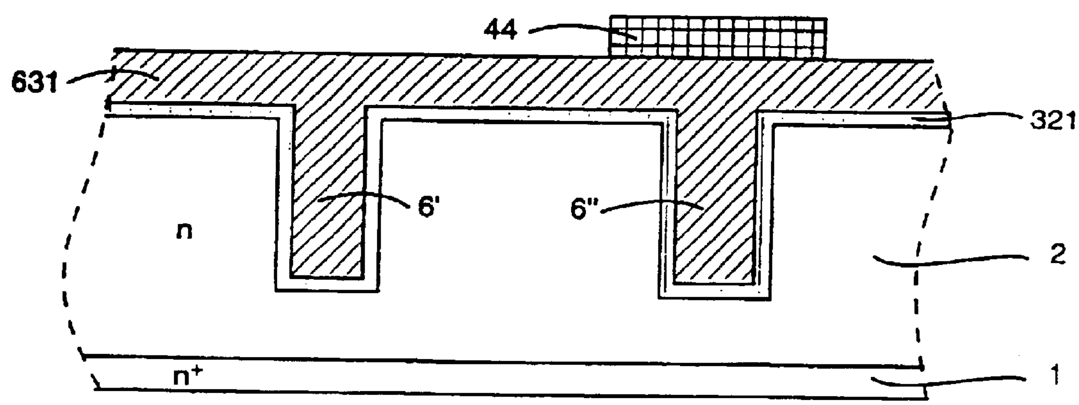
Figure 1F:
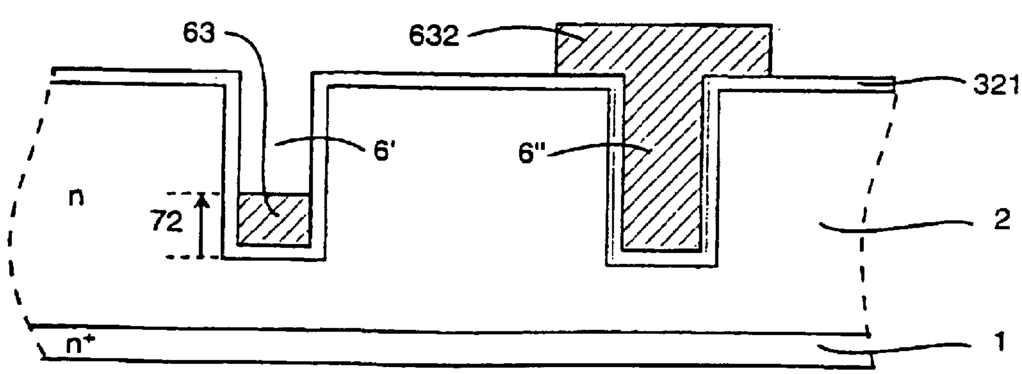
Figure 1G:
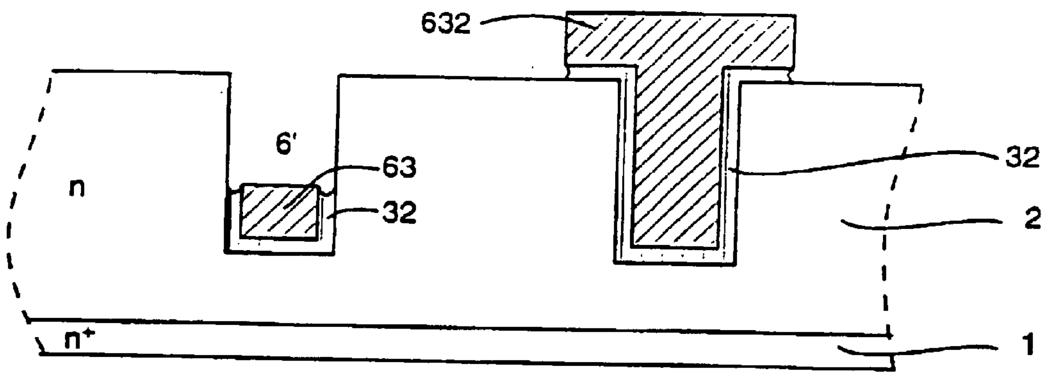
Figure 1H:
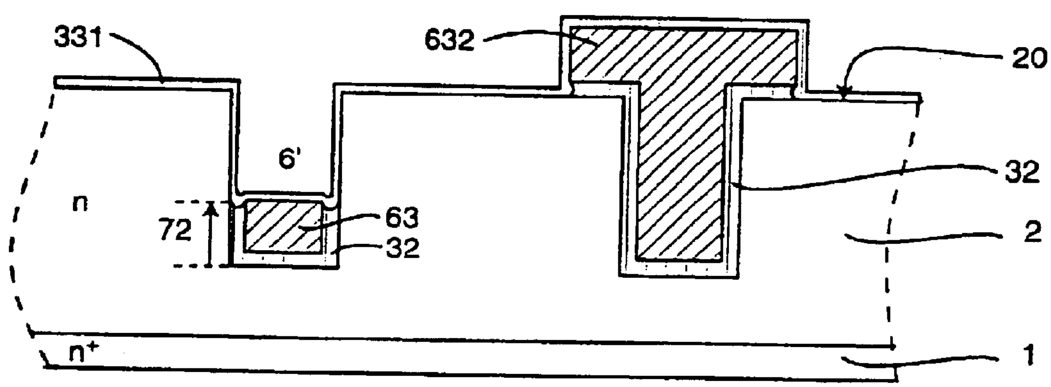
Figure 1I:
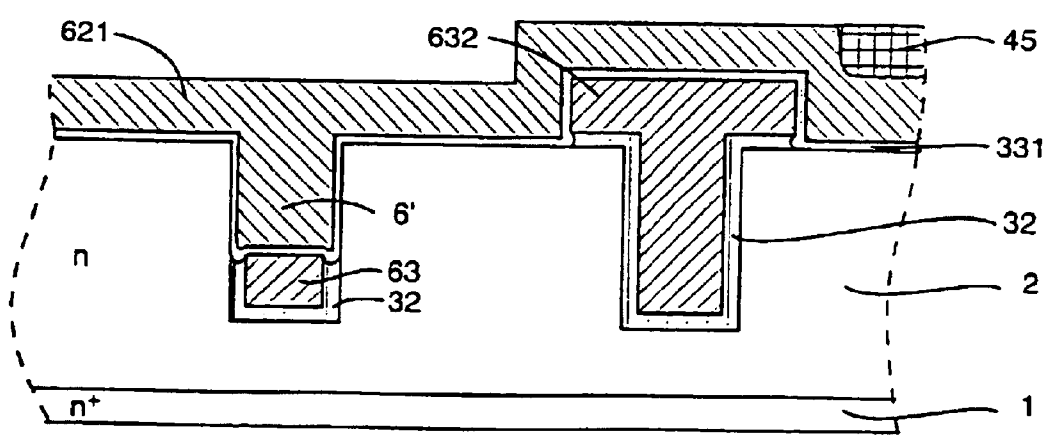
Figure 1J:
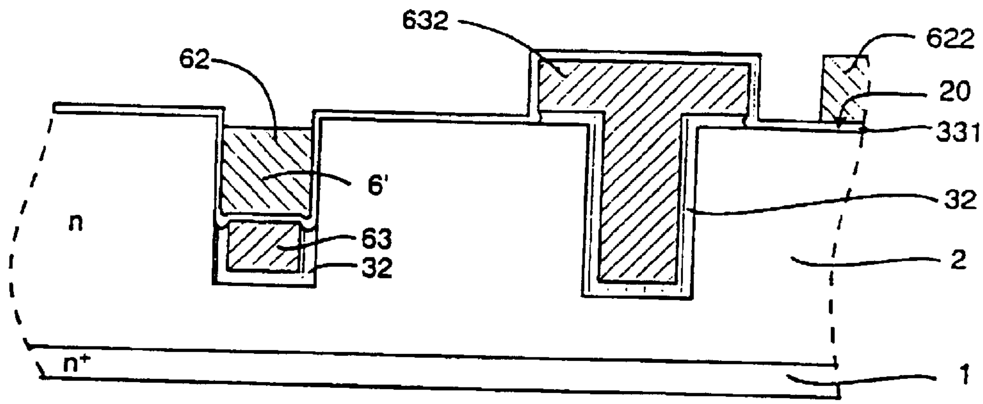
Figure 1K:
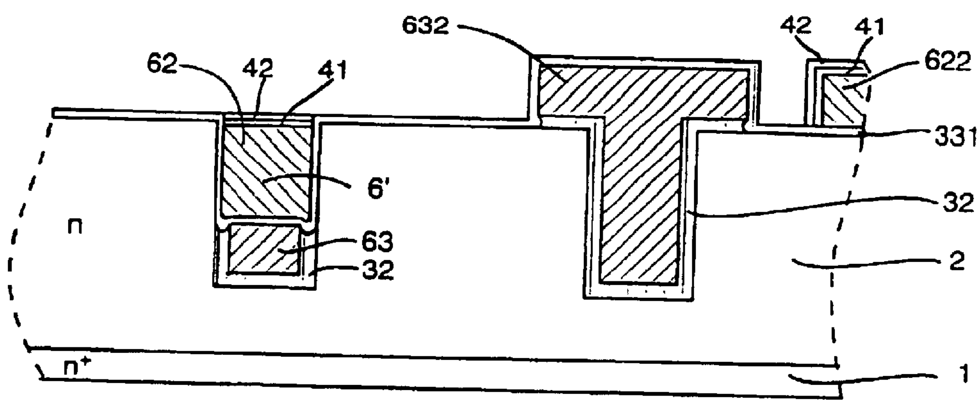
Figure 1L:
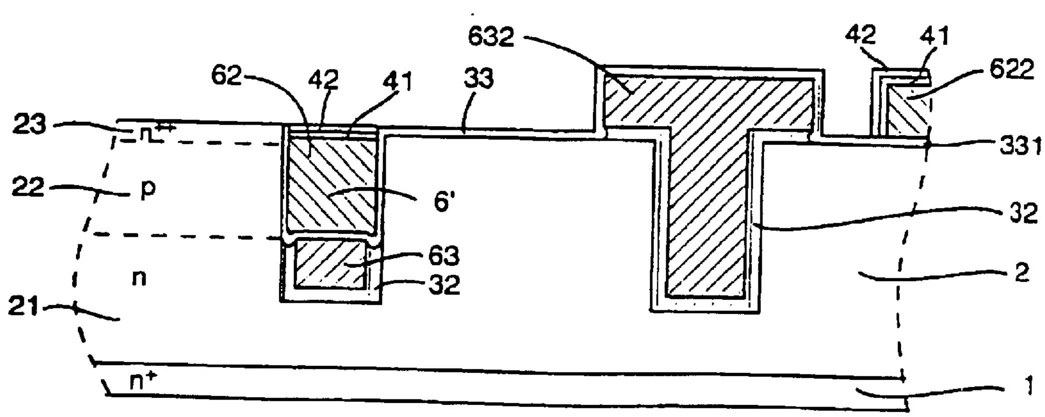
Figure 1M:
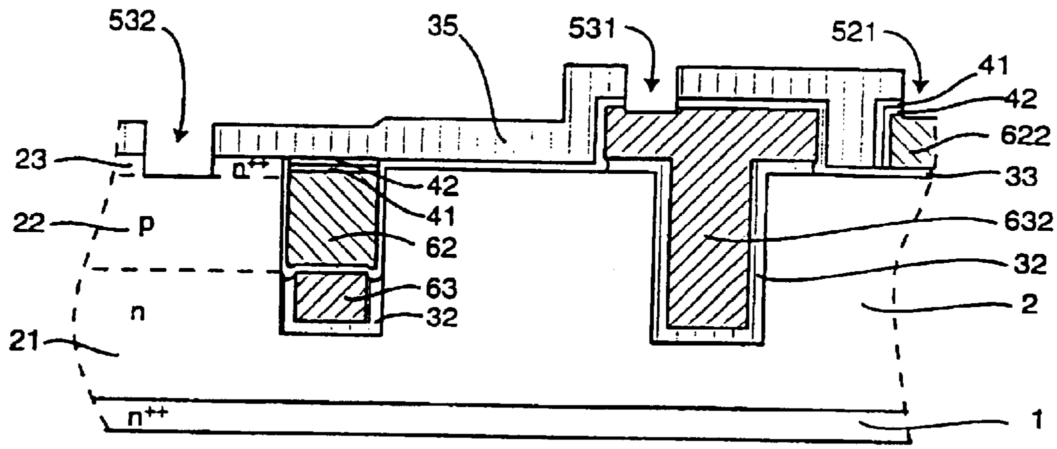
Figure 1N:
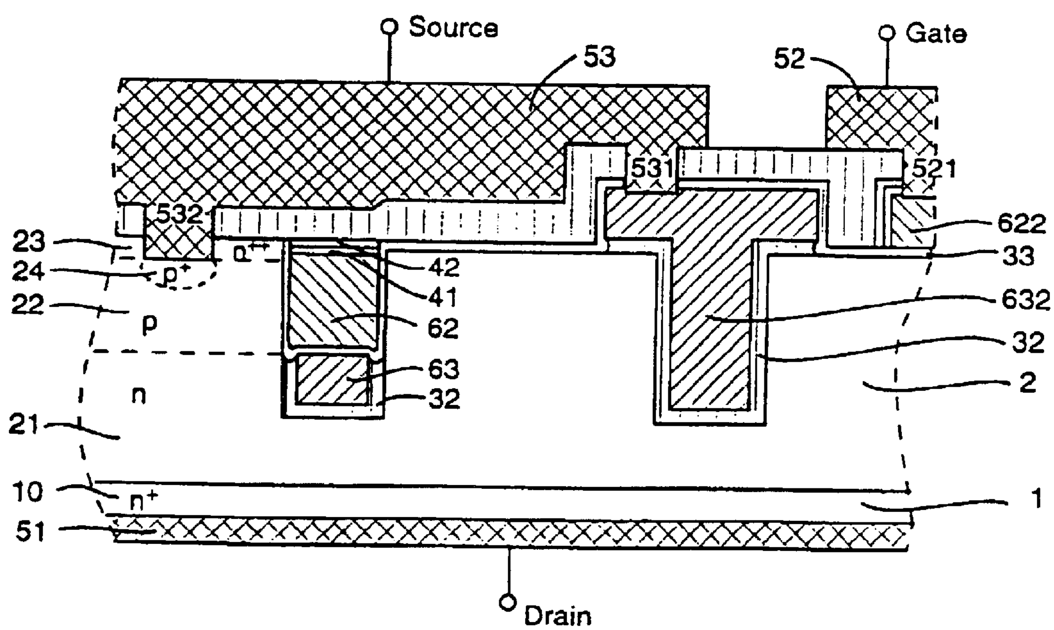

Referring now to the figures of the drawings in detail and first, particularly to FIGS. 1A to 1N thereof, there is shown a first embodiment of a method according to the invention; the method has eleven steps. In this case, the figures each illustrate a cross section through the same trench transistor cell in each case in an active cell region (on the left) and an edge region (on the right) in two mutually parallel cross-sectional planes. In this case, structures for making contact with the field electrodes and gate electrodes disposed in trenches are provided in the edge region.

Thus, in accordance with the first exemplary embodiment of the method according to the invention, an epitaxial layer 2 is produced on an $n^+$-doped basic substrate 1 by an epitaxial method. During the growth (in situ) of the epitaxial layer 2, the latter is n-doped.

Afterward, a hard mask 30 is produced on the substrate surface 20—opposite to the basic substrate 1—of the epitaxial layer 2, for example by depositing TEOS with a layer thickness of 400 nm. A first photoresist layer 43 is deposited in turn on the hard mask 30 and patterned by photolithographic technology. The result of the preceding method steps is illustrated in FIG. 1A.

Afterward, the hard mask 30 is etched at the sections left free by the patterned photoresist layer 43. The result is a patterned hard mask 30 with openings 61 at which the epitaxial layer 2 is uncovered, as illustrated in FIG. 1B.

Afterward, trenches 6 are etched into the epitaxial layer 2 and residual sections of the hard mask 30 and of the first photoresist layer 43 are removed.

FIG. 1*c* illustrates the structure thus obtained. The trenches 6 are formed in the epitaxial layer 2, which is disposed on the basic substrate 1. The trenches 6 may have a strip-like structure, formed from a plurality of trenches 6 running parallel, or a net structure. A net structure is produced by transverse trenches connecting the trenches 6 illustrated in cross section to one another in a cross-sectional plane parallel to the plane illustrated.

In the subsequent method step, a first dielectric layer 321 is deposited or produced by thermal oxidation on the epitaxial layer 2 patterned by the trenches 6.

FIG. 1D illustrates the dielectric layer 321, deposited or produced on the surface of the epitaxial layer 2 and on the inner surfaces of the trenches 6, together with the epitaxial layer 2 and the basic substrate 1.

Polycrystalline silicon (polysilicon) is then deposited in a next method step. The deposition is effected with a layer thickness that is greater than half the trench width. It is then ensured that the trenches 6 are filled completely with the polysilicon. A second photoresist layer 44 is deposited onto the polysilicon 631 (field polysilicon) deposited in this way and is patterned in a photolithographic method.

FIG. 1E illustrates the trenches 6 filled with the polysilicon 631. In this case, a residual section of the photoresist layer 44 lies above the right-hand trench 6", which constitutes a trench in the edge region.

An etching step is carried out at the sections of the polysilicon layer 631 that are not covered by residual sections of the photoresist 44. The etching step is terminated as soon as the material of the polysilicon layer 631 in uncovered trenches 6 has been etched back down to the desired depth, typically the body height.

FIG. 1F illustrates remaining sections 63, 632 of the polysilicon layer 631. In this case, the section 63 in the left-hand trench 6' forms a field electrode. The section 632 in the right-hand trench 6" serves for making contact with the field electrode 63 in a vertical extension—perpendicular to the cross-sectional plane—of the left-hand trench 6'.

In the next method step, the dielectric layer 321 is etched back, the field polysilicon that forms the sections 63 and 632 forms a mask.

The configuration illustrated in FIG. 1G results after the etching step. In this case, the dielectric layer 321 is still present in sections 32, below the field polysilicon 63, 632.

The gate dielectric layer 331 (also gate oxide hereinafter) is deposited thereon or produced thereon by thermal oxidation.

FIG. 1H illustrates the gate dielectric layer 331, which, in sections, covers the surface of the epitaxial layer 2, the polycrystalline sections 63 and 632, and also the uncovered sections of the inner surfaces of the trenches 6. Field electrodes 63 are disposed in lower regions (field regions) of the trenches 6 below the body height 72. The field electrodes are led via polycrystalline structures 632 over the substrate surface 20 of the epitaxial layer 2.

A second layer 621 made of a polycrystalline silicon (gate polysilicon) 621 is subsequently deposited. This deposition is also effected with a layer thickness that is greater than half the open trench width. In edge regions, the polycrystalline layer 621 can be masked again, and patterned, by a third photoresist layer 45 in a photolithographic method.

FIG. 1I illustrates the result of this method step. The gate polysilicon 621 covers the substrate surface and is masked in sections by a third photoresist layer 45.

Afterward, the gate polysilicon 621 is etched back in the regions not covered by residual sections of the photoresist layer 45 to an extent such that it only just fills the trenches 6' as far as the substrate surface 20 (also "silicon edge" hereinafter). Residual sections of the photoresist layer 45 are subsequently removed. The result is illustrated in FIG. 1J. The gate polysilicon 621 has given rise to gate electrodes 62 in the upper regions of the trenches 6' of the active cell array and further sections 622 in the edge region. The gate electrode 62 is led over the substrate surface 20 via the sections 622.

A first variant of the first exemplary embodiment of the method according to the invention illustrated by FIG. 1 then provides for the application of a highly conductive layer (silicide layer, e.g. tungsten silicide) 41 at least on the gate polysilicon 62. Such a silicide layer has a very good conductivity and reduces the nonreactive resistance in the feed to the gate electrodes 62 of the trench transistor cells. In a second variant of the first exemplary embodiment of the method according to the invention, the gate electrode 62 is sealed, with or without a highly conductive portion, with an oxide layer, a nitride layer or a multilayer system as diffusion barrier 42 in order to prevent an outdiffusion of dopants from the gate polysilicon 62, 622. The highly conductive layer 41 and/or the diffusion barrier 42 may also be disposed at a different point in the method, for instance after the gate dielectric layer has been made to recede or after the fashioning of channel and source zones 22, 23.

FIG. 1K illustrates a configuration in which both a highly conductive layer 41 and the diffusion barrier 42 have been applied on the gate electrode 62. The diffusion barrier 42 is inherently applied over the whole area. However, the illustration in FIG. 1*k* shows only the functionally essential part of this layer on the gate electrode 62.

The implantation of the source zone 23 and of the channel zone 22 is prepared in the next method step. To that end, by way of example, the gate oxide 33 is removed in sections from the substrate surface 20 and a screen oxide is applied or an implantation mask is provided.

As illustrated in FIG. 1L, the p-conducting channel zone 22 and also the $n^{++}$-conducting source zone 23 are then fashioned in each case in successive implantation, activation and diffusion processes. The untreated residual section of the epitaxial layer 2 forms a drift layer 21. Source and channel zones 23, 22 extend at least in each case in the active cell array between the trenches 6.

As an alternative, the implantation is also effected through the relatively thin gate oxide 33.

In the subsequent method step, a further dielectric layer 35 is deposited onto the configuration. This dielectric layer forms an intermediate oxide 35 for insulating the source zone, or for improved capacitive decoupling of the field polysilicon 632 and of the gate polysilicon 622 from a subsequently applied metallization plane.

FIG. 1M illustrates the intermediate oxide layer 35 deposited onto the structure, which layer covers the source zone 23 and the gate oxide 33 in sections openings 521, 531, 532 are etched in the dielectric layer 35, which openings either end before the silicon layer or extend into the latter. The openings that are produced are openings 532, in which the source zone 23 is uncovered, openings 531, which open the field polysilicon 532 in sections, and openings 521, which uncover the gate polysilicon 622 in sections.

Furthermore, a patterned metallization is applied above the configuration. The metallization has a source terminal metallization 53 and a gate terminal metallization 52. In this case, the gate terminal metallization 52 makes contact with the sections 622 of the gate polysilicon via plated-through holes 521. Furthermore, in this example, the source terminal metallization 53 makes contact with the source zones 23 and the channel zones 22 via plated-through holes 532 and with the sections 632 of the field polysilicon via plated-through holes 531. A drain terminal metallization 51 is subsequently applied on the rear side of the semiconductor substrate. The drain terminal metallization makes contact with the basic substrate 1, which forms a drain zone 10.

As an alternative to this, contact is made with the field polysilicon 632 by an additional field metallization insulated from the source terminal metallization 53.

Figure 2:
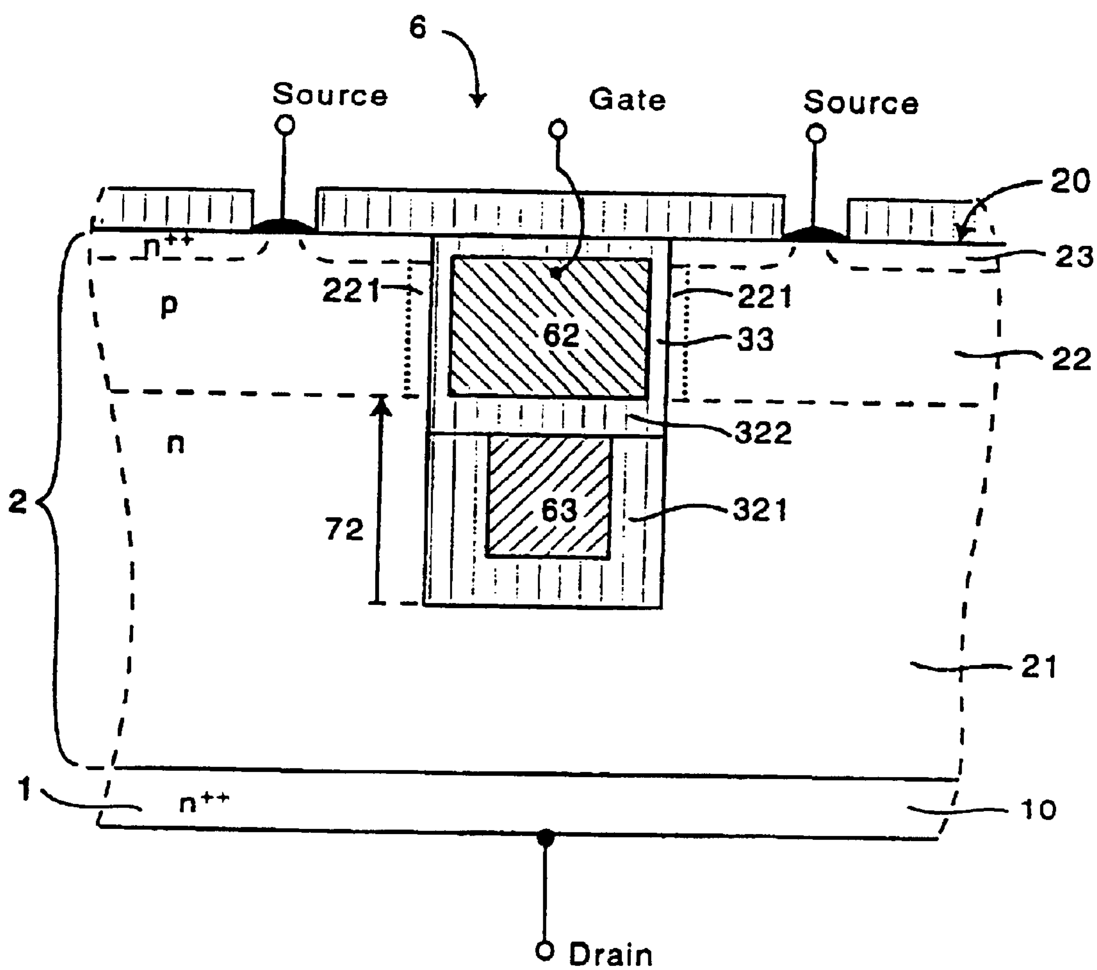
FIG. 2 is a partial sectional view showing a trench MOS power transistor according to the prior art.
Figure 3A:
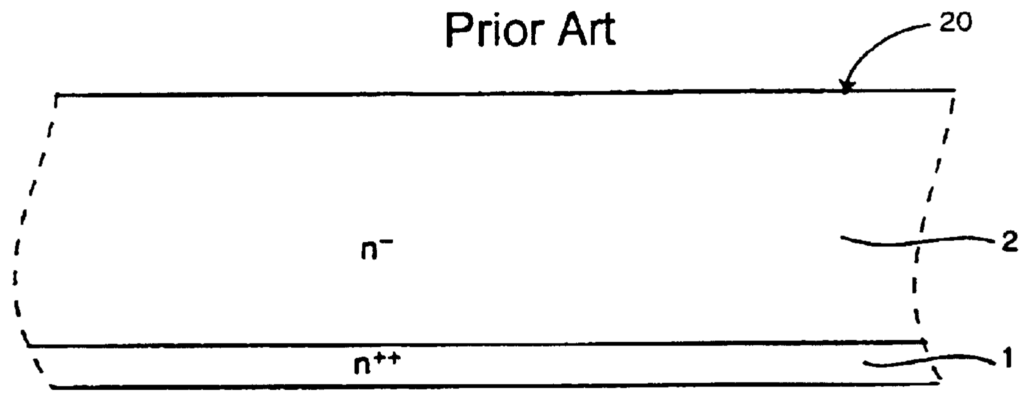
FIGS. 3A–3I are partial sectional views showing a method for fabricating a trench MOS power transistor.
Figure 3B:
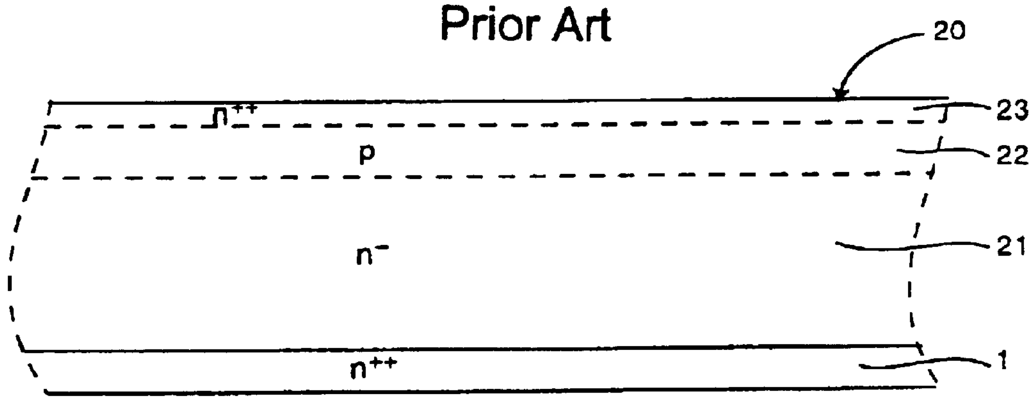
Figure 3C:
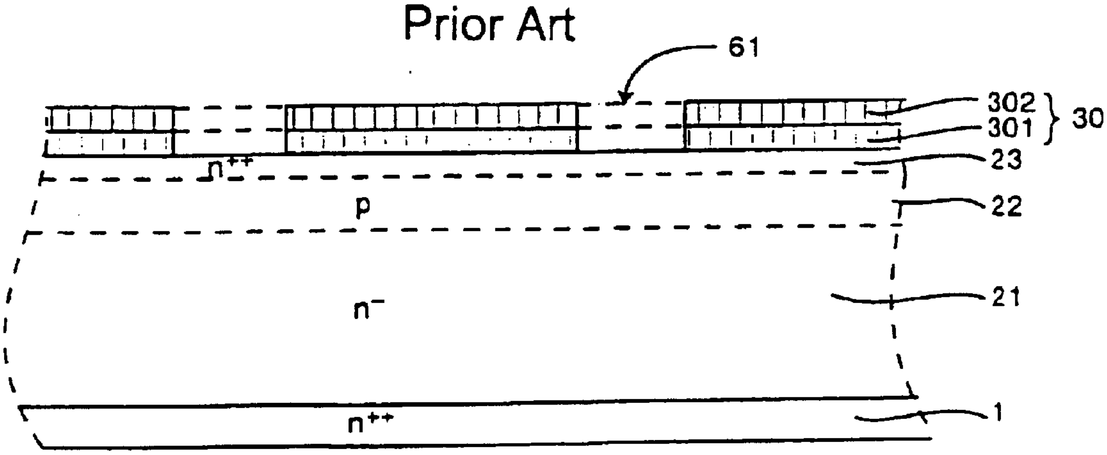
Figure 3D:
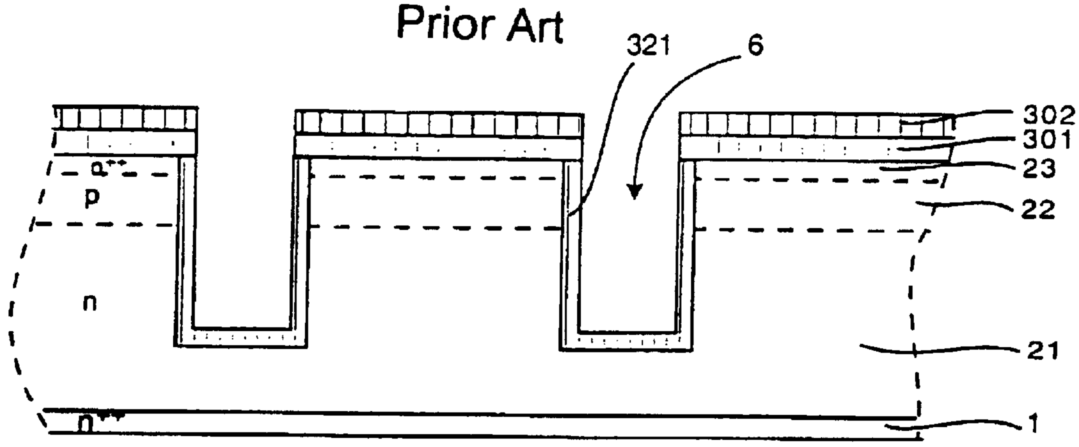
Figure 3E:
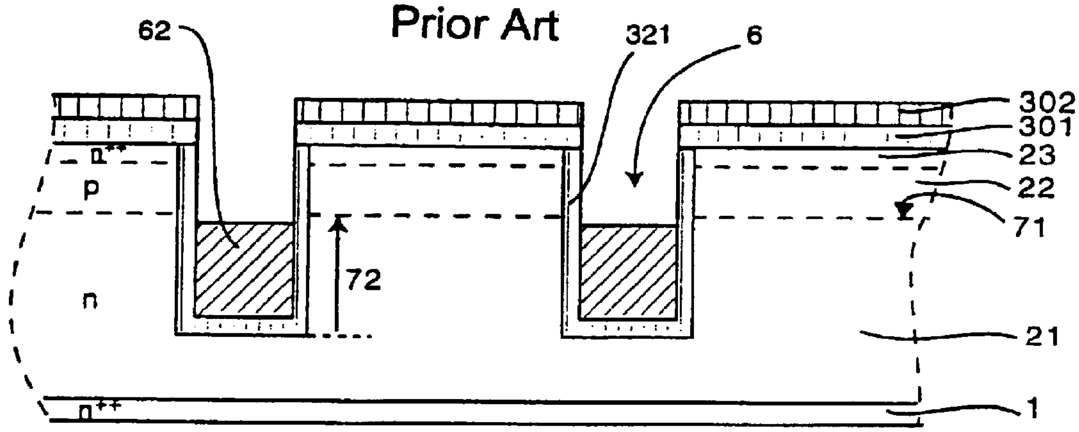
Figure 3F:
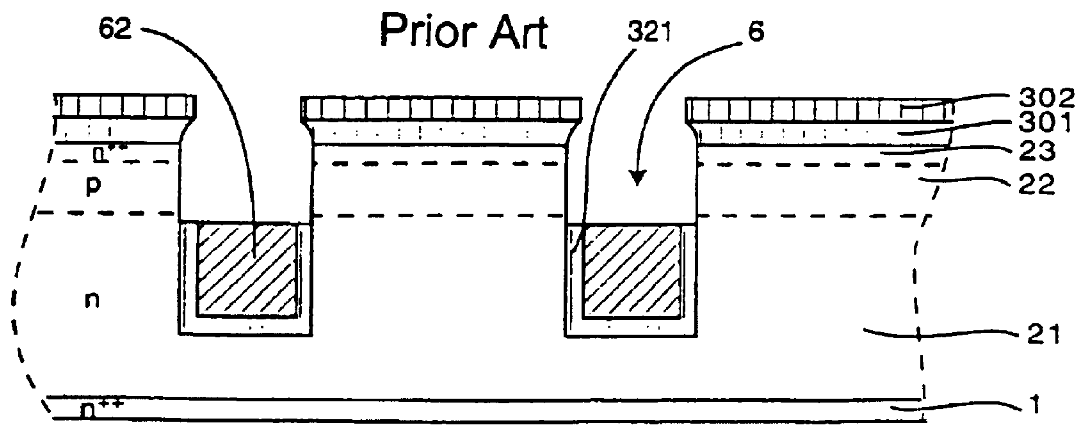
Figure 3G:
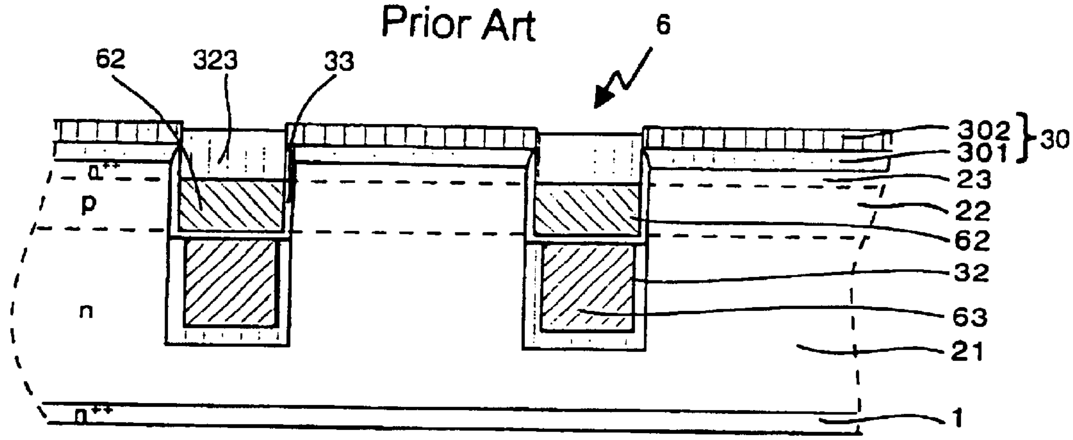
Figure 3H:
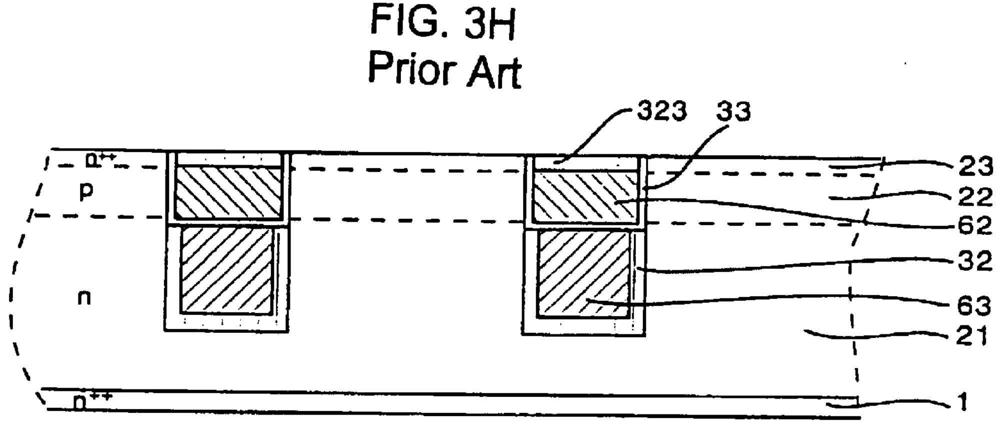
Figure 3I:
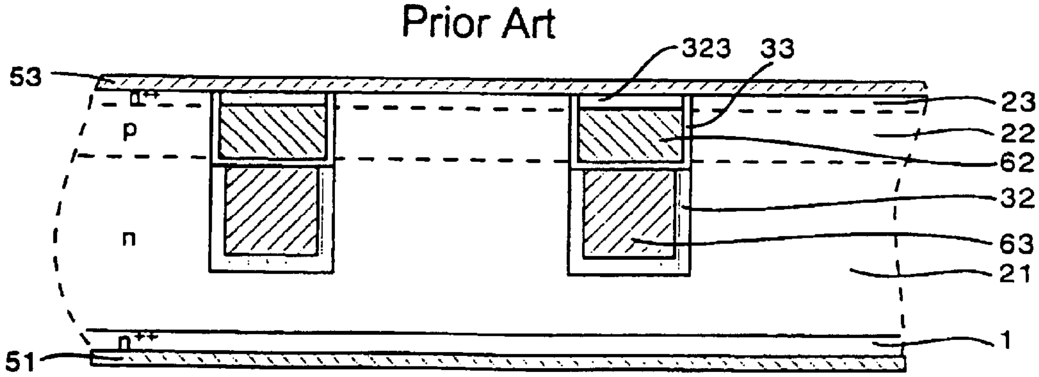

FIGS. 2 and 3 have already been explained in the Background.

Figure 4A:
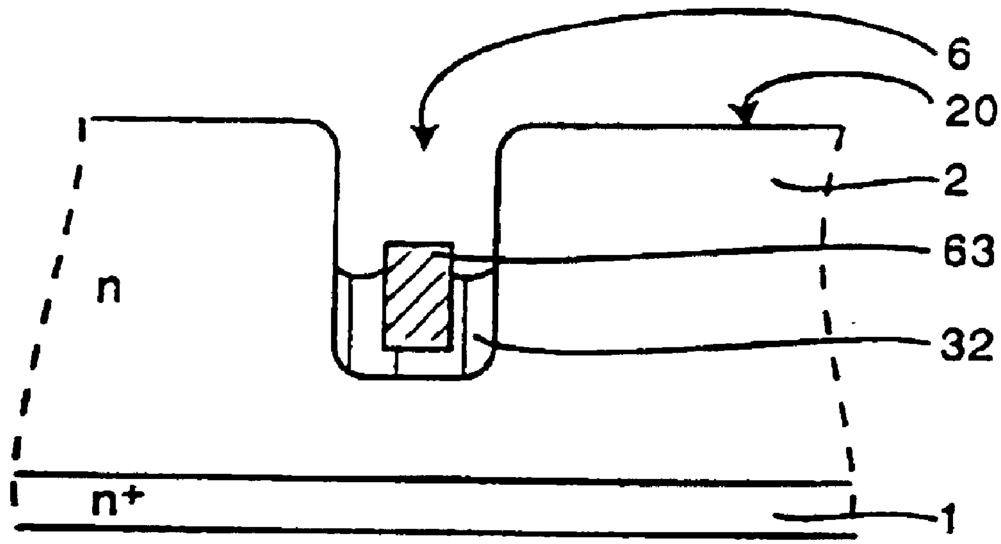
FIGS. 4A–4B are partial sectional views showing the steps of a second embodiment of the method according to the invention for fabricating a transistor.
Figure 4B:
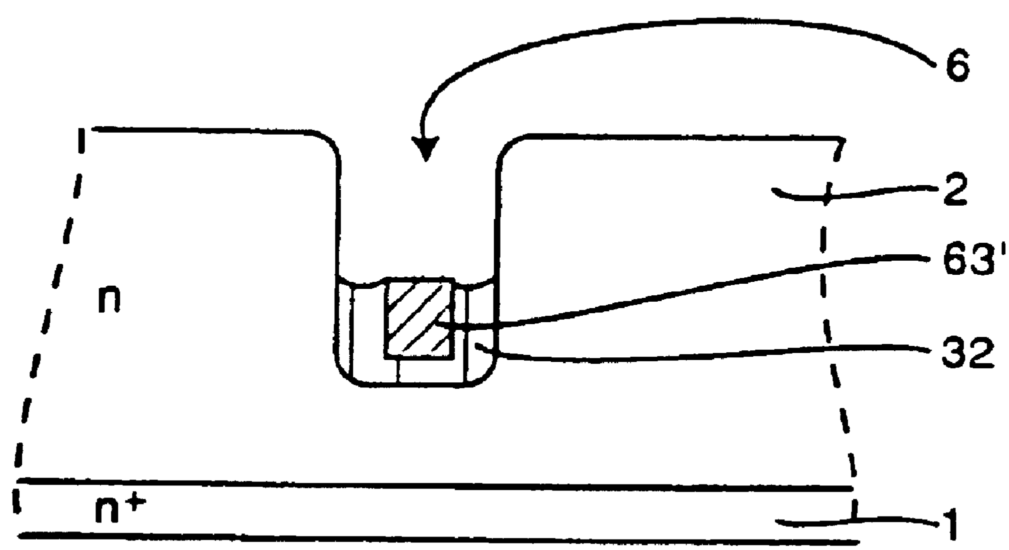

FIGS. 4A and 4B diagrammatically illustrate the region of a trench transistor cell before and respectively after a method step that is characteristic of a second exemplary embodiment of the invention.

After the shaping of a field electrode 63, this method step follows the removal or reduction of the first dielectric layer 321 in regions not covered by the field electrode 63.

These method steps (already explained) lead to a configuration illustrated in FIG. 4*a*. During the etching back of the first dielectric layer 321, without further measures, the first dielectric layer 321 is also made to recede in the interspace between the field electrode 63 and the epitaxial layer 2 to below the surface of the field electrode 63. As a result, the field electrode 63 is partially uncovered in an upper region facing the substrate surface 20.

According to the second exemplary embodiment of the method according to the invention, in an additional method step, the uncovered upper region of the field electrode 63 is then made to recede to below the surface of the first dielectric layer 32 oriented toward the substrate surface 20. The reduction of the field electrode 63 to a reduced field electrode 631 associated with this method step is advantageously associated with a reduction of a capacitance between the field electrodes 63' and a gate electrode 62 that is subsequently formed.

FIGS. 5A to 6E illustrate the method steps that characterize a third exemplary embodiment of the invention with reference to a cross section through the region of a trench transistor cell in a simplified and diagrammatic manner.

Figure 5A:
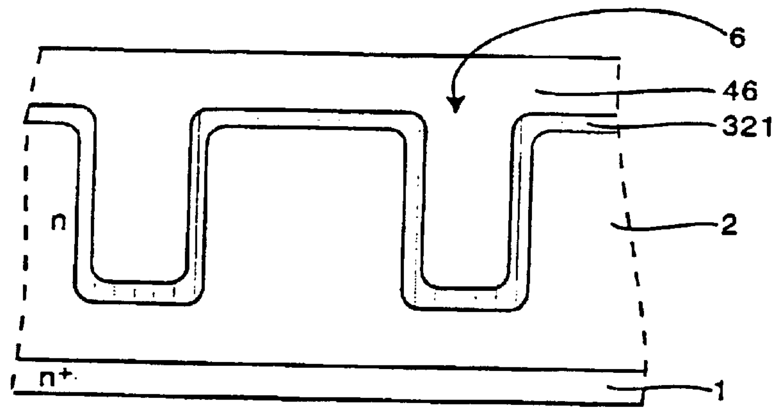
FIGS. 5A–5E are partial sectional views showing the steps of a third embodiment of the method according to the invention for fabricating a transistor.

The configuration illustrated in FIG. 5A results in a customary manner from the application of a first dielectric layer 321 to the epitaxial layer 2 patterned by trenches 6. A first auxiliary layer, for example a photoresist layer 46, which completely fills the trenches 6, is subsequently applied to the first dielectric layer 321.

Figure 5B:
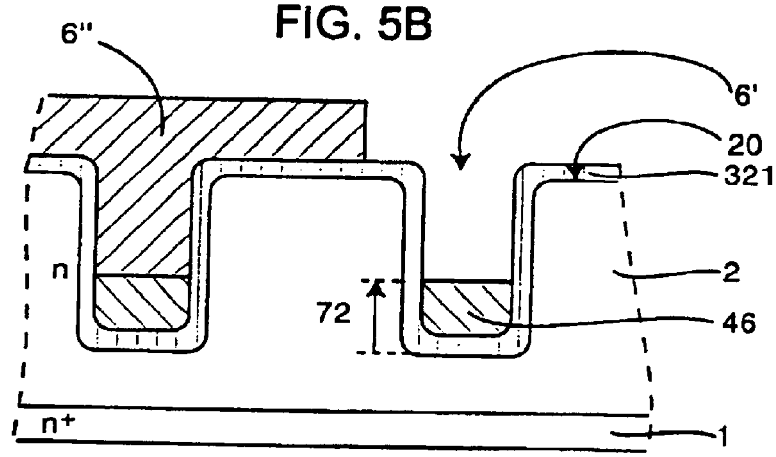

In a subsequent method step, the photoresist layer 46 is made to recede, so that residual sections of the photoresist layer 46 remain exclusively in lower regions of the trenches 6, as is illustrated in FIG. 5B.

FIG. 5B illustrates the trench 6 of FIG. 5A in two different cross-sectional planes. The cross section 6" depicted in the left-hand part illustrates the trench 6 in the edge region of a transistor configuration, in which contact is made with the gate electrode disposed in the trench 6 and with the field electrode. The right-hand cross section 6' illustrates the trench 6 in the active region of the trench transistor cell.

In the edge region, the upper trench region and the adjoining substrate surface 20 are additionally covered by a second auxiliary layer 47.

A body height 72, approximately as far as which the trenches 6 are filled with the material of the photoresist layer 46, corresponds to a junction between a channel zone and a drift zone in the semiconductor substrate. The junction is formed in the later method sequence. The required filling height can be realized with a material that has a lower etching rate, with smaller deviations than with a material with a high etching rate.

Figure 5C:
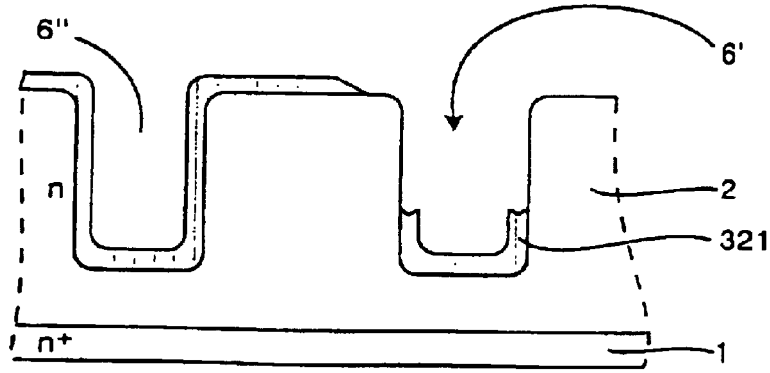

In a subsequent method step, the first dielectric layer 321, in the regions that are not covered either by the photoresist layer 46 or by the second auxiliary layer 47, at least has its layer thickness reduced or, as illustrated in FIG. 5C, is completely removed. After the patterning of the first dielectric layer 321, the residual sections of the two auxiliary layers 46, 47 are removed.

The result of this method step is illustrated it FIG. 5C. The lower region of the trench 6' in the active cell array is lined in well form with the first dielectric layer 321 in the lower region extending as far as the body height. In the edge region of the trench 6" illustrated on the left, the first dielectric layer 321 is drawn out of the trench 6" with an unreduced layer thickness right over the substrate surface 20.

Figure 5D:
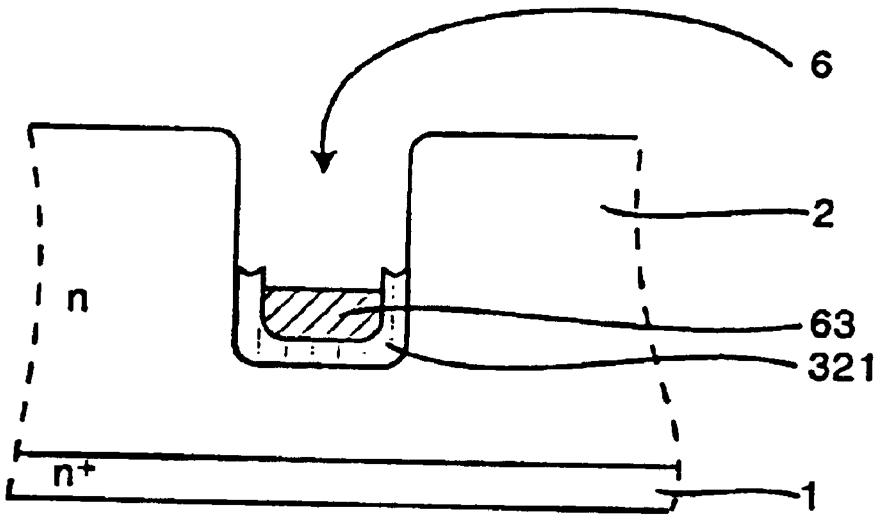

Afterward, the field polysilicon is deposited and etched back as far as the collar of the well formed by the first dielectric layer 321 in the lower trench region. FIG. 5*d*, which illustrates the result of this method step, reveals sections of the first dielectric layer 321 that project above the surface formed by the field electrode 63.

In a variant of this exemplary embodiment of the method according to the invention, a method step is inserted that causes the first dielectric layer 321 to recede at least as far as the surface of the field electrode 63.

Figure 5E:
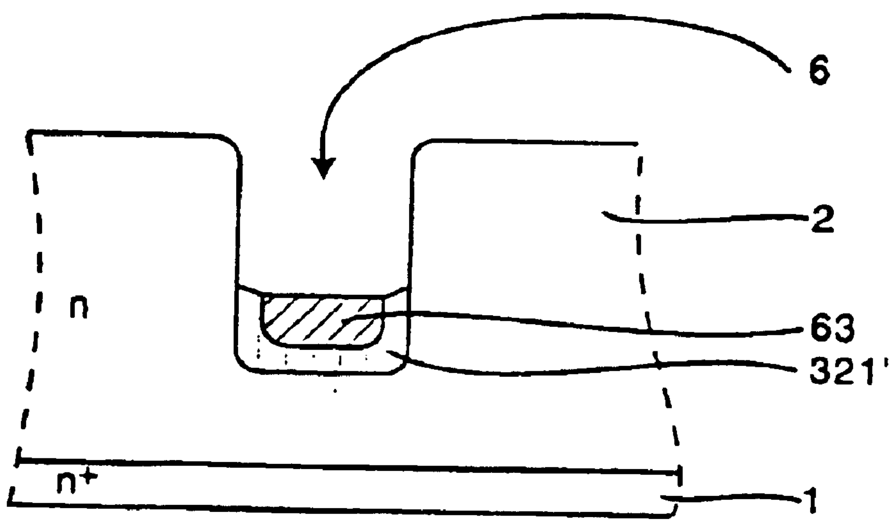

This method results in the configuration illustrated in FIG. 5E, in which the field electrode 63 essentially completely fills the well formed by the first dielectric layer 321.

FIGS. 6A to 6E diagrammatically illustrate the method according to the invention in accordance with a fourth exemplary embodiment with reference to a cross section through the region of a trench transistor cell.

Figure 6A:
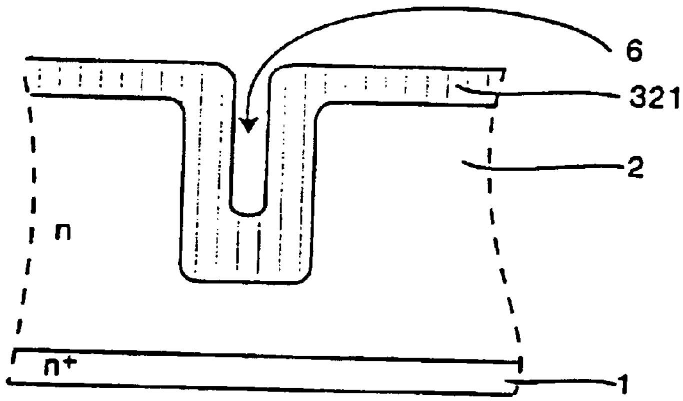
FIGS. 6A–6E are partial sectional views showing a fourth embodiment of a method according to the invention for fabricating a transistor.
Figure 6B:
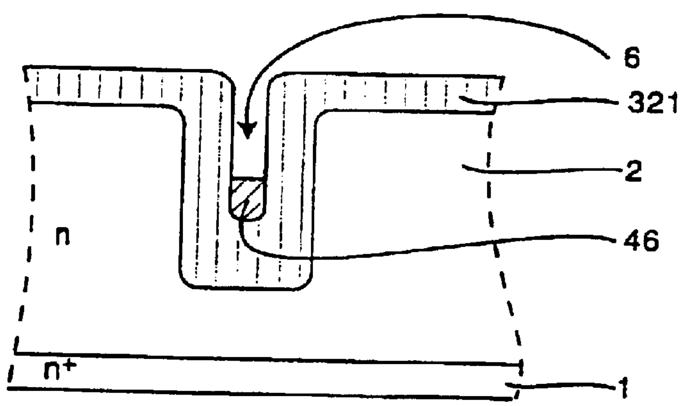

In accordance with FIG. 6A, firstly a first dielectric layer 321 is applied, in a known manner, to the epitaxial layer 2 patterned by trenches 6. Afterward, the lower regions of the trenches 6 are masked, in a known manner, with an auxiliary layer, for instance a photoresist layer 46, as illustrated in FIG. 6B.

Figure 6C:
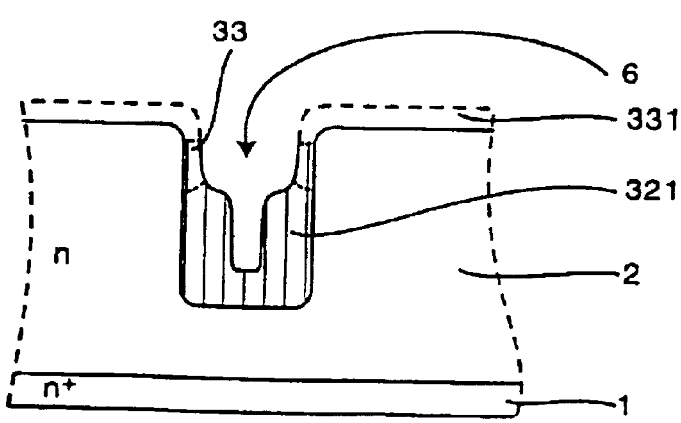
Figure 6D:
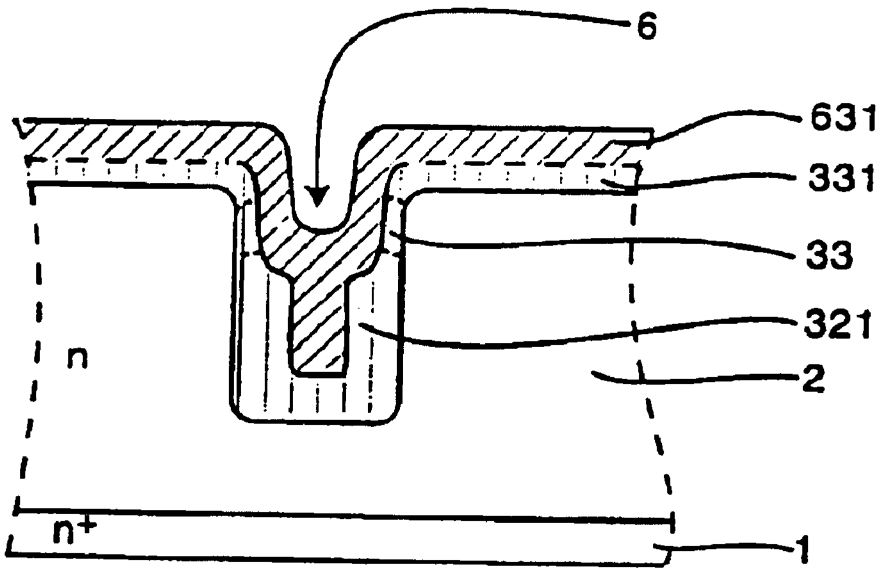

Using the photoresist layer 46 as a mask, the layer thickness of the dielectric layer 321 is reduced. In this case, a second dielectric layer 331 forms in sections not covered by the photoresist layer 46 on the substrate surface and a gate oxide 33 or an auxiliary layer forms at the inner surf aces of the trench 6 in the upper region. The photoresist layer 46 is then removed. FIG. 6C illustrates the state of the configuration after the preceding method step.

In the subsequent method step, a field polysilicon 631 is deposited conformally onto the configuration. In this case, the deposition is effected with a layer thickness which is greater than half the width of the well formed by the first dielectric layer 321 in the lower trench region, and less than half the collar width of a collar formed by the gate oxide 33 in the upper trench region. The configuration illustrated in FIG. 6D results in the event of a conformal deposition of the field polysilicon with the layer thickness explained above.

Figure 6E:
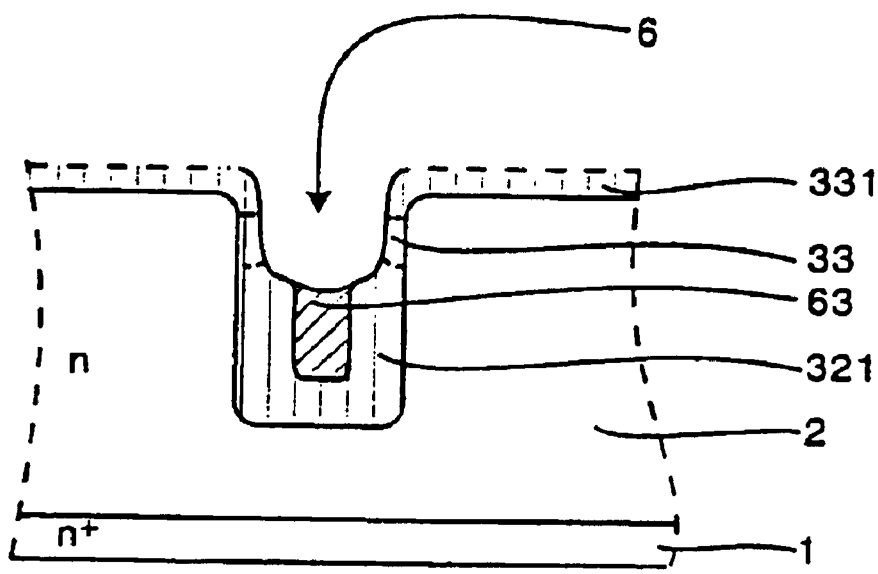

In the subsequent method step, the field polysilicon is then etched back by an amount which corresponds to the previously deposited layer thickness, supplemented by a slight overetch. The field polysilicon is essentially made to recede as far as the junction between the first dielectric layer 321 and the gate oxide 33, as illustrated in FIG. 6E.

FIGS. 7A to 7D illustrate the crucial method steps of a fifth exemplary embodiment of the method according to the invention with reference to a cross section through the region of a trench transistor cell.

Figure 7A:
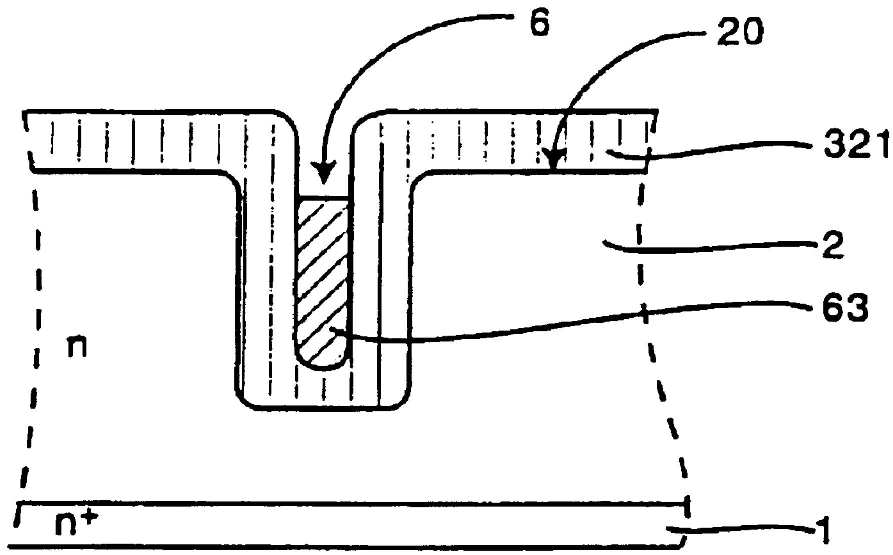
FIGS. 7A–7D are partial sectional views showing a fifth embodiment of the method according to the invention for fabricating a transistor.
Figure 7B:
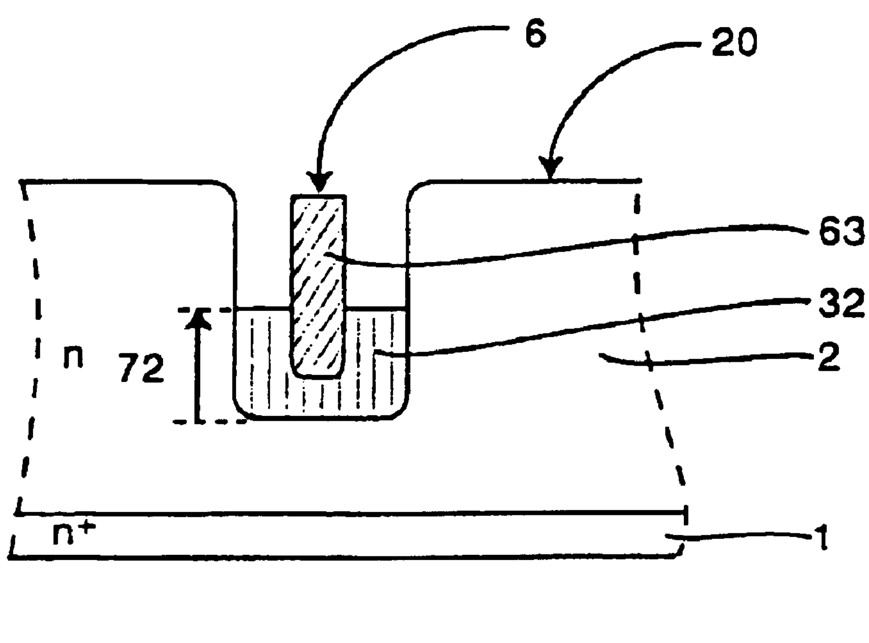

In this case, as emerges from FIG. 7A, after a deposition, a field polysilicon is made to recede only as far as approximately the substrate surface 20 of the epitaxial layer 2. The field electrode 63, together with the first dielectric layer 321, then fills the trench 6 partially or, as illustrated here, virtually completely.

Afterward, the first dielectric layer 321 is etched back in the regions masked by the field electrode 63. In this case, as emerges from FIG. 7B, the first dielectric layer 321 is etched back as far as a body height 72 and, in the process, forms sections 32 corresponding to a drift zone/channel zone junction in the semiconductor substrate. The junction is formed in the later method sequence.

Figure 7C:
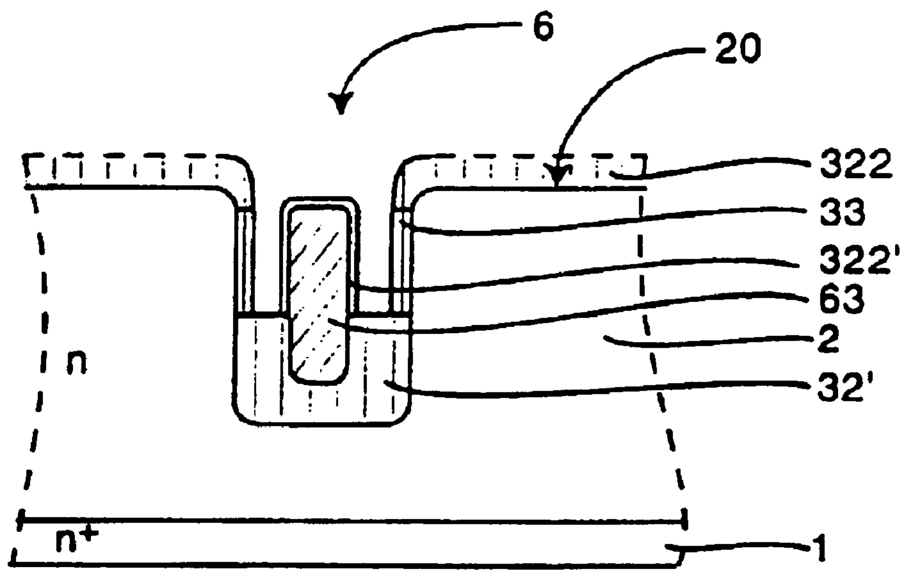
Figure 7D:
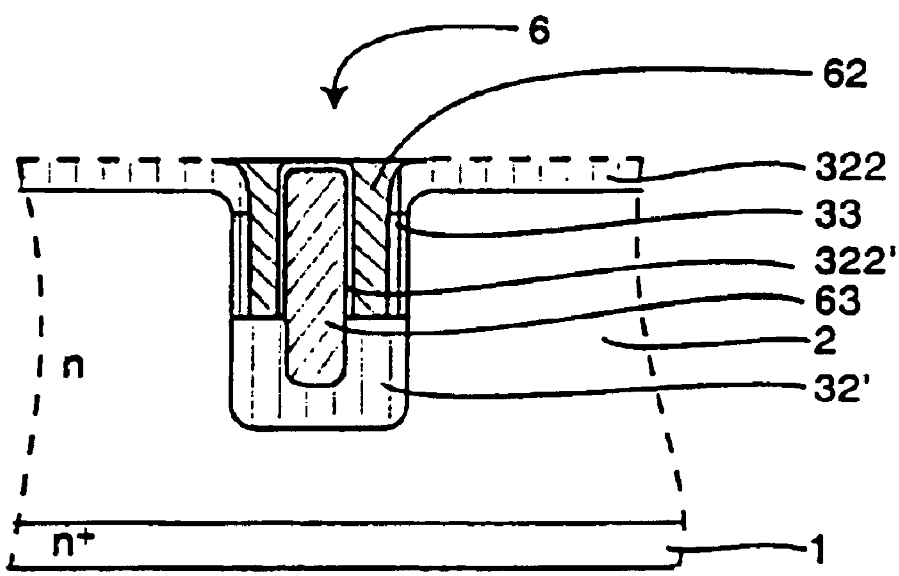

In the interspaces that form in this way between the field electrode 63 and the epitaxial layer 2, a gate oxide 33 is applied which is thin in comparison with the first dielectric layer 32. The gate oxide 33 may be applied by deposition or by thermal oxidation. FIG. 7C shows the state of the configuration after the application of the gate oxide 33 by thermal oxidation.

The layers 322 on the substrate surface 20 of the epitaxial layer 2 that are formed in sections by thermal oxidation, the gate oxide 33 formed at the inner surfaces of the trenches 6 in the upper region and also the second dielectric layer 322' formed on the surface of the field electrode can be gathered from FIG. 7C.

In a subsequent method step, for instance by deposition and etching back, the gate polysilicon is introduced into the wells that have then been formed with the gate oxide 33 and sections—of the second dielectric layer 322'. The gate polysilicon, as can be gathered from FIG. 7D, then forms a gate electrode 62 enclosing the field electrode 63 in the upper trench region.

FIGS. 8A to 8E illustrate the crucial method steps for fashioning a gate oxide and a dielectric layer on the field electrode in accordance with the method according to the invention with reference to a cross section through the region of a trench transistor cell.

Figure 8A:
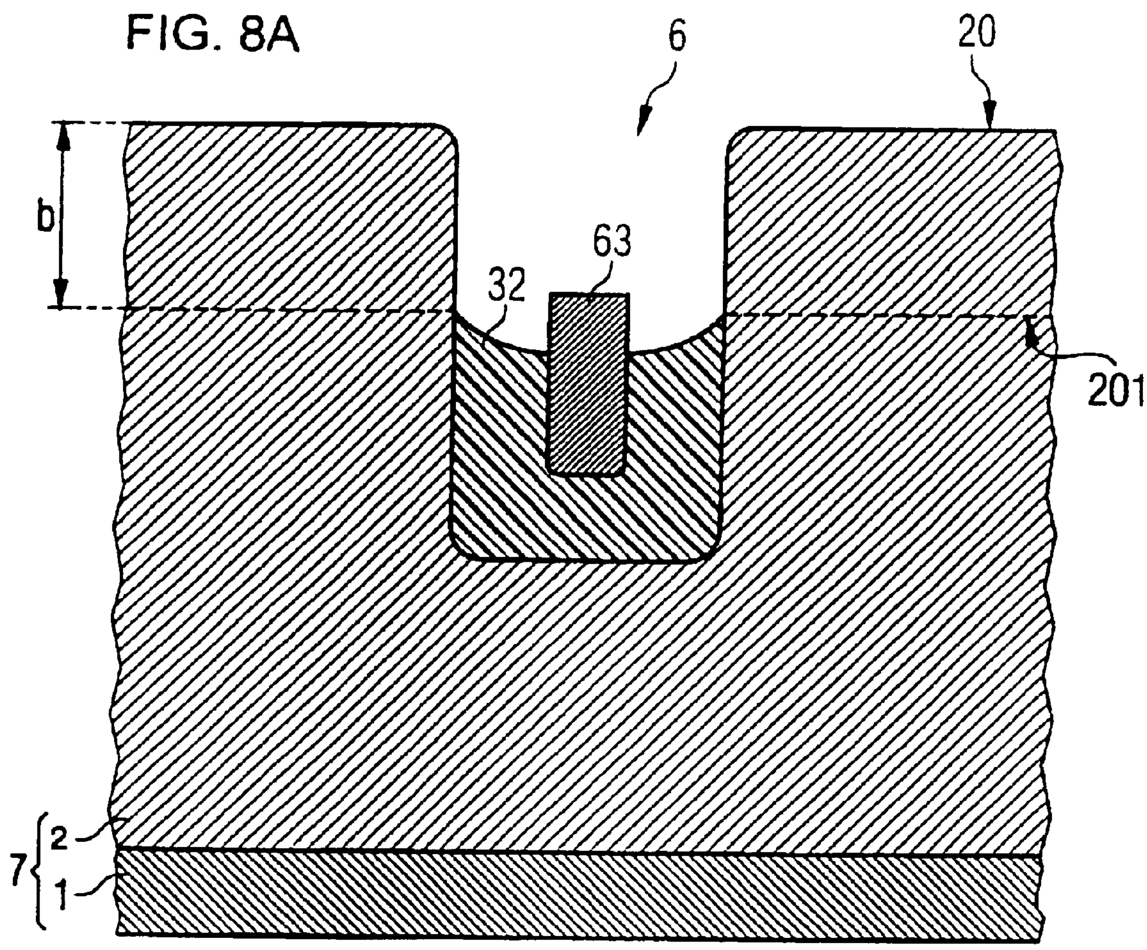
FIGS. 8A–8E are partial sectional views showing exemplary embodiments of configurations of the gate dielectric layer and the dielectric layer between field electrode and gate electrode.

FIG. 8A shows a trench 6 of a trench transistor cell which is introduced into a process layer 2, disposed for its part on a basic substrate 1. The trench 6 is lined with a first dielectric layer 32 below, for instance, a body-drain junction 201 at a distance b from a substrate surface 20. The first dielectric layer 32 insulates a field electrode 63 from a semiconductor substrate 7 formed from the basic substrate 1 and the process layer 2. Because of an etching back of the first dielectric layer 32 after the introduction of the field electrode 63, the first dielectric layer 32 is made to recede to below the upper edge of the field electrode 63.

Figure 8B:
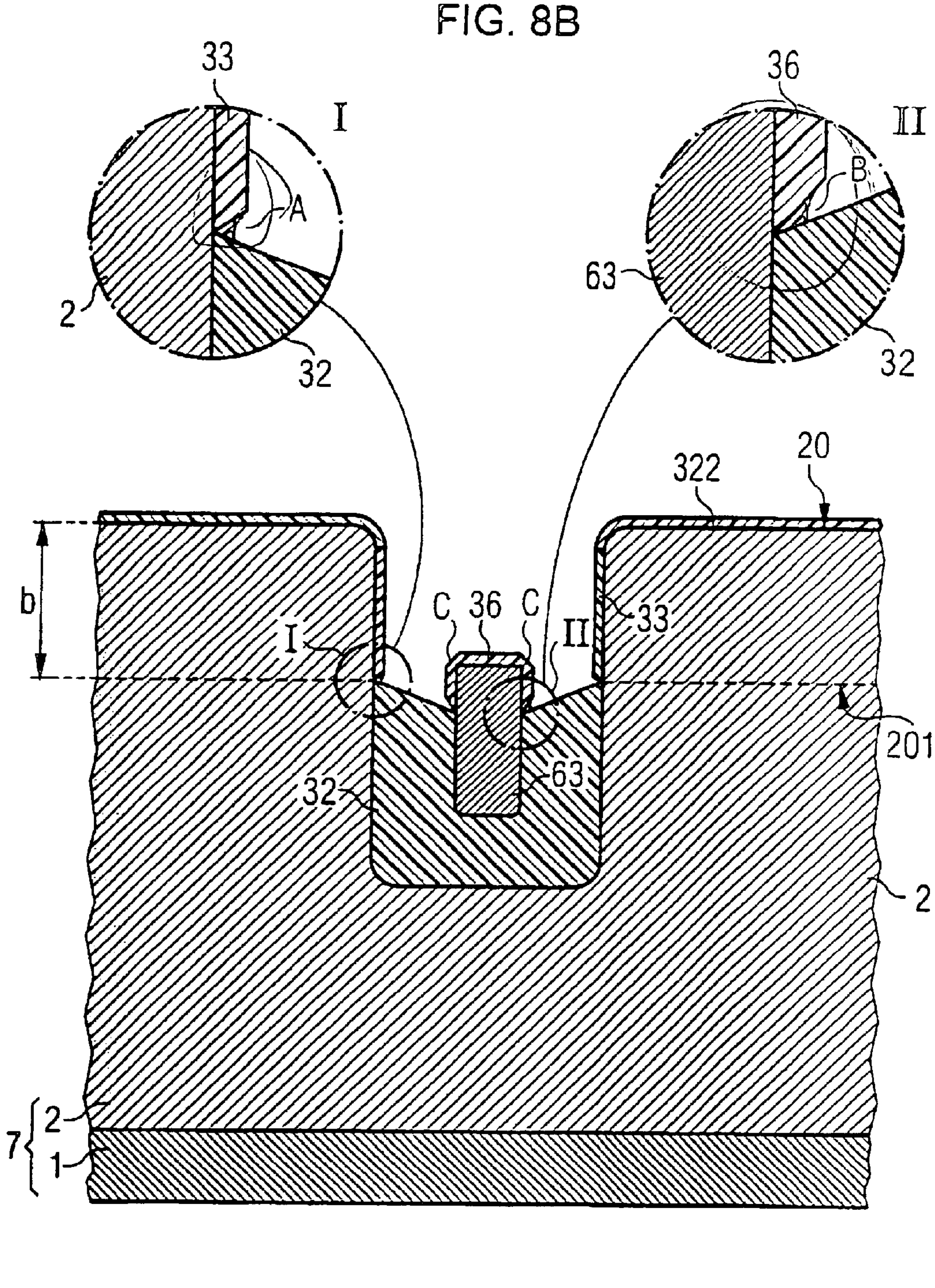

FIG. 8B illustrates the configuration shown in FIG. 8A after a customary thermal oxidation step. As a result of the thermal oxidation, oxide layers are formed in each case on the material of the weakly doped process layer 2 and the field electrode 63. In this case, in sections, a gate oxide 33 is formed at the uncovered sections of the trench wall, a second oxide layer 36 is formed on the uncovered sections of the field electrode 63, and a further oxide layer 322 is formed on the substrate surface 20. In this case, the gate oxide 33, the oxide layer 36 on the field electrode 63 and the further oxide layer 322 on the substrate surface 20 have approximately the same layer thickness. In the event of a thermal oxidation with customary process control, thin oxide points A, B form at junctions between the first dielectric layer 32 and the gate oxide 33 and also between the first dielectric layer 32 and the oxide layer 36 on the field electrode 63. A further thin oxide point C is produced in the oxide layer 36 on the field electrode 63 at the uncovered edges of the field electrode 63.

Figure 8C:
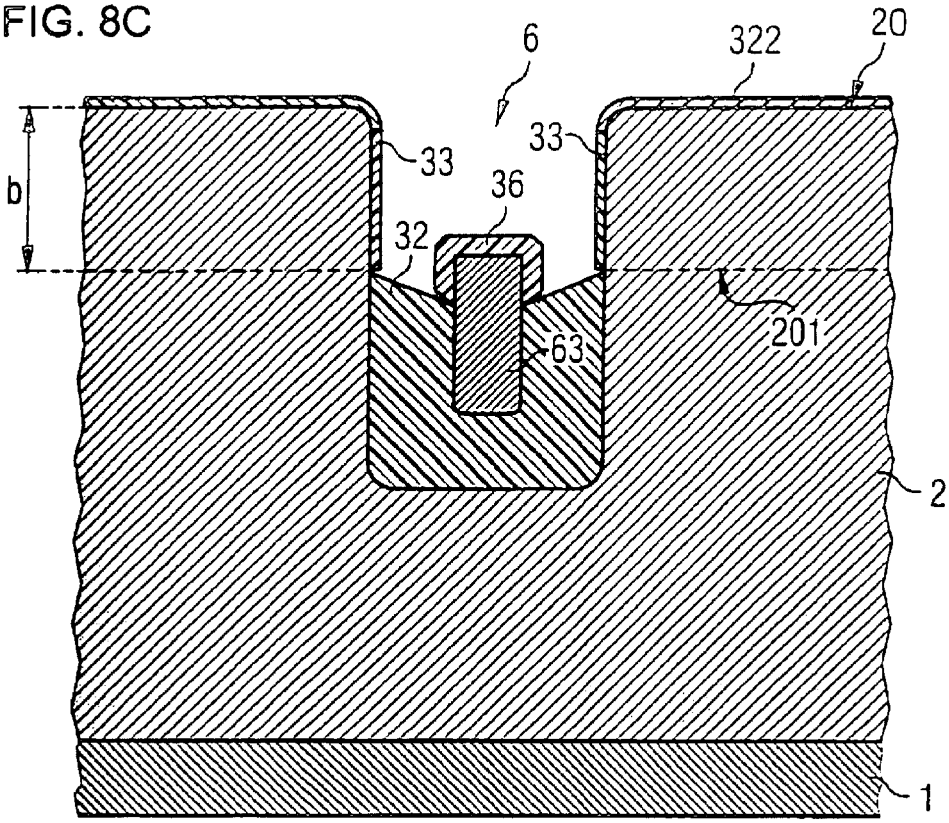

FIG. 8C illustrates the conditions after a moist oxidation of the configuration shown in FIG. 8A. In this case, the oxide layer 36 on the field electrode 63 is produced with a significantly higher layer thickness than the gate oxide 33. The thinning of the thin oxide points A, B, C is significantly less pronounced than after a customary thermal oxidation.

Figure 8D:
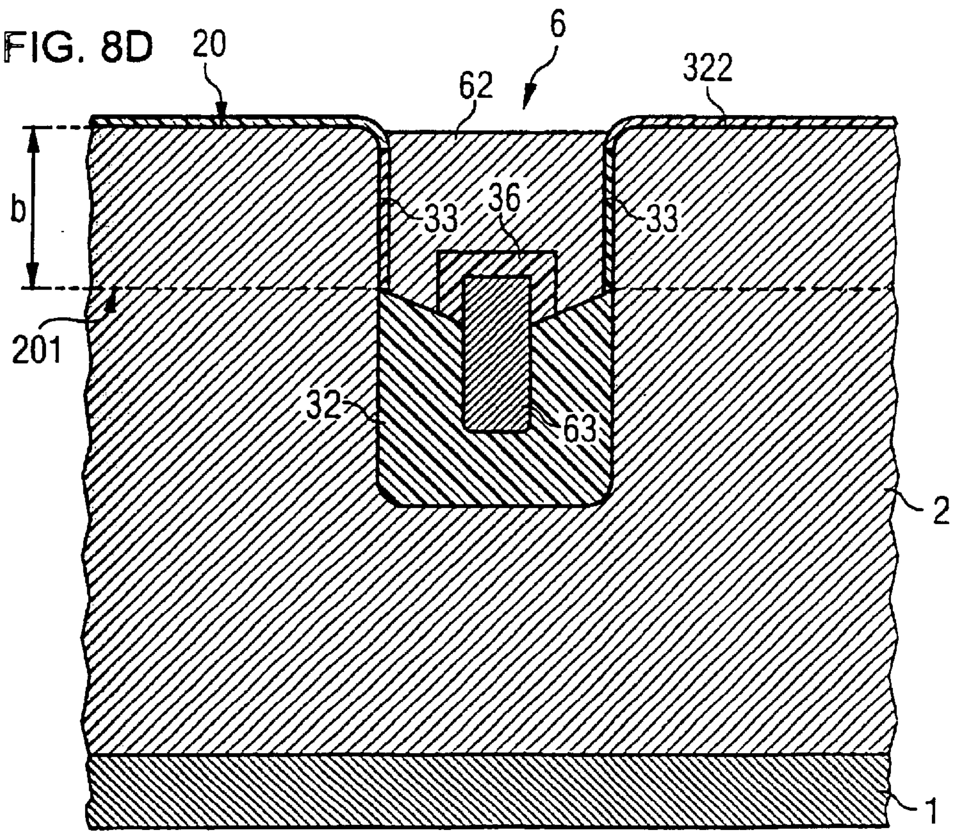

FIG. 8D diagrammatically illustrates the state of the trench transistor cell shown in FIG. 8C after a dry oxidation—following a moist oxidation—at about eleven-hundred degrees Celsius (~1100° C.) and a subsequent introduction of a gate electrode 62 into the trench 6 as far as approximately the upper edge of the trench 6. The thinning of the thin oxide points A, 8, C has been appreciably reduced through higher oxidation rates present there.

Figure 8E:
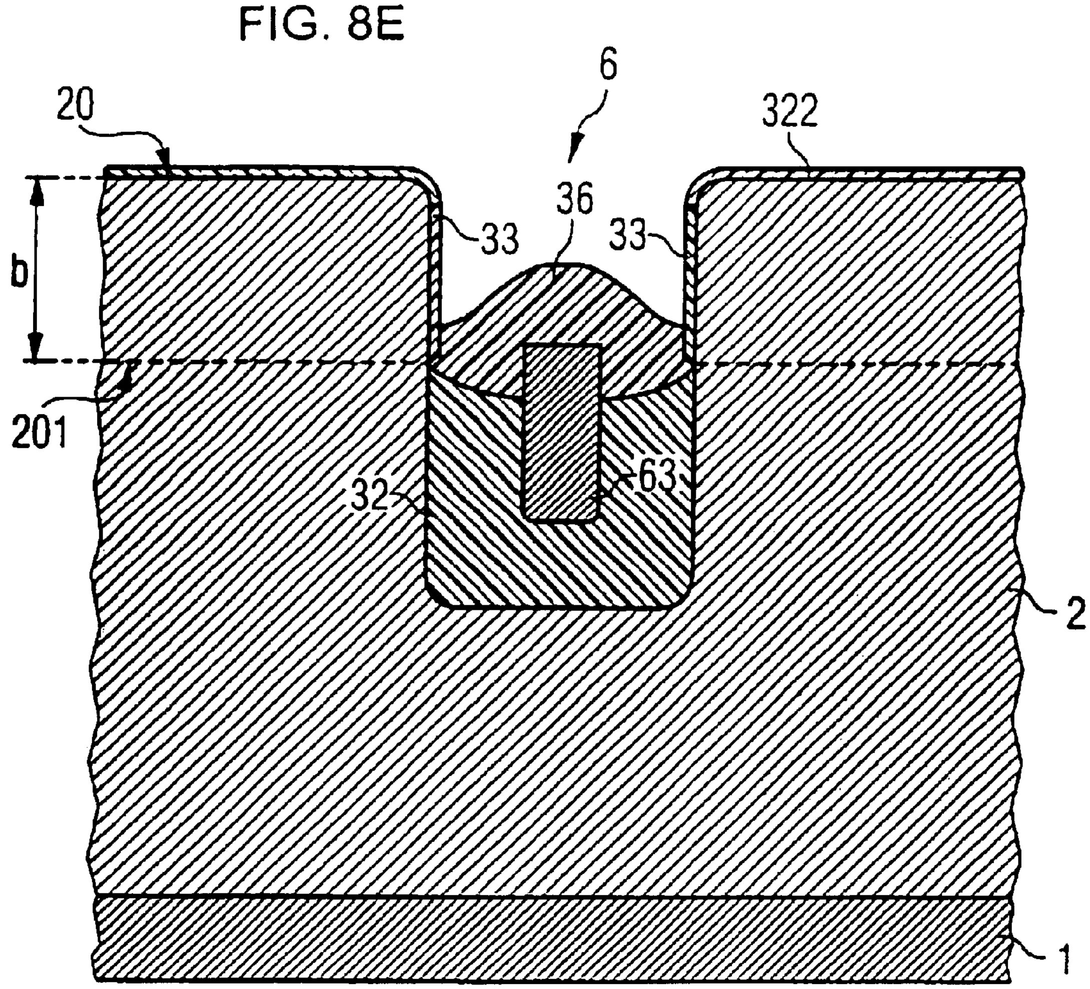

FIG. 8E represents the state of a configuration in accordance with FIG. 8A after an oxide layer 36 has been produced on the field electrode 63 by an HDP process. In this case, the HDP oxide formed here may be deposited to a varying extent. In the example shown, the HDP oxide extends beyond a lower edge of the gate oxide 33. A higher breakdown protection of the oxide layer 36 on the field oxide 63 in comparison with the breakdown protection of the gate oxide 33 is ensured in this embodiment.

EXAMPLES

In all the examples below, the order of some steps, for example of the implantation operations, may vary. The gate electrode may include a plurality of layers or be reinforced in sections with a highly conductive material. In the region of the trench, the gate electrode may also project above the silicon surface p-channel transistors and IGBTs are also possible. The process sequence may be inserted into an IC process in which the drain zone is led to the substrate surface via an n-type sinker.

Example A a) Provision of a highly doped n+-type substrate as starting material.

b) Deposition of an n-type epitaxial layer with a dopant concentration of $1\times10^{14}$ $cm^{-3}$ to $1\times10^{18}$ $cm^{-3}$.

c) Etching of the trenches using a patterned trench mask (oxide, TEOS 400 nm, photoresist). Removal of the trench mask. Fashioning of the trench as strip or as grid for a cell structure.

d) Application of an insulation layer having a thickness of a few nm to a few μm. In this case, the insulation layer may also be a multilayer system (thermal oxide, deposited oxide, nitride)

e) Deposition of a field electrode, in which case the material of the field electrode may contain doped polysilicon, silicides (tungsten silicide) and other conductive materials. In this case, a polysilicon is deposited with a layer thickness amounting to at least half the trench width, reduced by the thickness of the insulation layer.

f) Masked or unmasked etching back of the field electrode to distinctly below the substrate surface of the epitaxial layer.

g) Optional masking of a part of the insulation layer, for instance by photoresist.

h) Partial or complete removal of the insulation layer in regions not covered by the field electrode or photoresist. Growth of the gate oxide with a thickness of a few nm to more than 100 nm in accordance with the requirements made of a threshold voltage.

i) Deposition of the gate electrode (doped polysilicon, silicide, tungsten silicide).

j) Masked or unmasked etching back of the material of the gate electrode to below the substrate surface (silicon upper edge).

k) Optional application of a highly conductive layer (silicide layer, tungsten silicide) to the material of the gate electrode in order to increase the conductivity thereof.

l) Optional sealing of the gate material with an oxide layer (deposited oxide, nitride, multilayer system) in order to avoid an outdiffusion of dopants.

m) Implantation, unmasked or masked by field oxide or a dedicated phototechnology, and subsequent outdiffusion of the channel zone.

n) Implantation of the source zone, unmasked or masked by field oxide or a dedicated phototechnology, and activation or outdiffusion.

o) Deposition of a dielectric for the insulation of gate metallization and source metallization.

p) Etching of the contact holes. In this case, the etching may stop on the substrate surface or, as an alternative, completely or almost completely etch through the source zone.

q) Masked implantation of the $p^{++}$-type body contact either in each cell or, given strip-type fashioning of the cells, only piecewise. In this case, during a subsequent metal deposition, both the source zone and the body contact region are connected in each cell or in each strip. During an etching of the contact hole into the silicon, the implantation is optionally effected unmasked, provided that the source zone at the trench walls is not subjected to doping reversal.

r) Deposition and patterning of the metallization.

s) Optionally deposition and patterning of the passivation.

Example B

As example A, but after the etching back of the field electrode and a partial or complete removal of the first dielectric layer, the field electrode is etched back once more in order to reduce the gate-source capacitance. In this case, a nitride layer is optionally a constituent of the first dielectric layer. The nitride layer is patterned and, after the etching back of the field electrode, is utilized as an etching mask for etching the first dielectric layer.

Example C a) Provision of a substrate.

b) Deposition of an n-type epitaxial layer with a dopant concentration of $1\times10^{14}$ $cm^{-3}$ to $1\times10^{18}$ $cm^{-3}$.

c) Etching of the trenches by using a patterned trench mask (oxide, for example TEOS 400 nm, photoresist). Removal of the trench mask. In this case, the trenches may be embodied in strip form, or as a lattice for a cell structure.

d) Application of a first dielectric layer having a thickness of a few nm to few μm. The first dielectric layer may also be a multilayer system.

e) Optionally application of an adhesion promoter (for example nitrides).

f) Optionally application of an auxiliary layer to above the silicon edge and etching back thereof down to the region of the lower edge of the channel zone (p-type well). If the material of the auxiliary layer is a photoresist, then a postbake is effected.

g) Optionally additional masking of an edge construction.

h) Optionally etching of the oxide.

i) Optionally removal of the auxiliary layer.

j) Optionally growth of an auxiliary oxide.

k) Optionally removal of the adhesion promoter.

l) Deposition and masked etching back of the material of the field electrode.

m) Optionally removal of the sections of the first dielectric layer that are not masked by the field electrode and growth of the gate oxide with a thickness of a few nm to more than 100 nm in accordance with the threshold voltage.

n) Deposition and doping of the material of the gate electrode.

o) Masked or unmasked etching back of the material of the gate electrode to below the silicon upper edge.

p) Optionally sealing of the gate electrode with a diffusion barrier (deposited oxide, nitride, multilayer system) in order to avoid an outdiffusion of dopants.

q) Implantation and outdiffusion or annealing of the channel zone and source zone, in each case unmasked or masked by field oxide, polysilicon or a dedicated phototechnology.

r) Deposition of a dielectric for the insulation of gate metallization and source metallization.

s) Etching of the contact holes.

t) Deposition and patterning of the metallization.

u) Optionally deposition and patterning of the passivation.

Example D a) Provision of an $n^+$-type basic substrates b) Deposition of an n-type epitaxial layer with a dopant concentration of $1\times10^{14}$ $cm^{-3}$ to $1\times10^{18}$ $cm^{-3}$.

c) Etching of the trenches using a patterned trench mask (oxide, for example TEOS 400 nm, photoresist), removal of the trench mask. Embodiment of the trenches as strip or as lattice of a cell structure.

d) Application of a first dielectric layer having a thickness of a few nm to a few μm. The first dielectric layer may also be a multilayer system.

e) Application of an auxiliary layer (for example photoresist) to above the silicon edge and etching back thereof to below the lower edge of the channel zone (p-type well); if the material of the auxiliary layer is a photoresist, then a postbake is effected.

f) Optionally additional masking of an edge construction.

g) Partial or complete etching of the first dielectric layer.

h) Removal of the auxiliary layer.

i) Optionally growth of an auxiliary oxide or an auxiliary layer.

j) Conformal deposition of the field electrode (polysilicon, silicide), the layer thickness of the deposition being thicker than (trench width/2—thickness of the first dielectric layer in the lower part) and thinner than (trench width/2—thickness of the first dielectric layer in the upper part). Masked isotropic etching back, the material of the field electrode being removed from the upper part by using an isotropic etching back and remaining in the lower part.

k) Optionally removal of the first dielectric layer that is not masked by the field electrode and growth of the gate oxide in accordance with the threshold voltage of a few nm to more than 100 nm.

l) Deposition and doping of the material of the gate electrode (typically polysilicon).

m) Masked or unmasked etching back of the material of the gate electrode to below the silicon upper edge.

n) Optionally sealing of the gate material with a diffusion barrier (deposited oxide, nitride, multilayer system).

o) Implantation and outdiffusion or annealing of the channel zone and of the source zone, in each case unmasked or masked by field oxide, polysilicon or a dedicated phototechnology.

p) Deposition of a dielectric for the insulation of gate metallization and source metallization.

q) Etching of the contact holes.

r) Deposition and patterning of the metallizations.

s) Optionally deposition and patterning of the passivation.

Example E

As exemplary embodiment 1, but the field electrode is etched back only a little into the trench. The subsequent isotropic removal of oxide distinctly undercuts the oxide. Growth of an oxide in the interspace between field electrode and epitaxial layer. Filling of the material of the gate electrode. In this case, the gate electrode is disposed in sections beside the field electrode.

Example F

Partial step for filling a trench and forming a dielectric layer (oxide layer) on the field electrode with simultaneous fashioning of a gate oxide.

a) Deposition of the material of the field electrode (phosphorous-doped polysilicon), b) Etching back of the material of the field electrode into the trench as far as approximately a body height.

c) Moist-chemical etching of the first dielectric layer (field plate).

d) Cleaning (HF-B, standard cleaning).

e) Oxidation of gate oxide and oxide layer on the field electrode.

f) Deposition of the material of the gate electrode into the trench.

g) Etching back of the material of the gate electrode (polysilicon) to below the trench edge.

We claim:

1. A method for fabricating a transistor configuration having a trench transistor cell, which comprises:

introducing a trench into a process layer of a semiconductor substrate;

providing a field electrode and a gate electrode in the trench;

electrically insulating the field electrode and the gate electrode from one another and from the process layer; and forming a drift zone, a channel zone, and a source zone in the process layer; at least one of the source zone and the channel zone being formed after the introducing of the trench into the semiconductor substrate.

2. The method according to claim 1, which further comprises:

defining a width $d_T$ of the trench;

after the introducing of the trench into the process layer, lining at least a section of the trench with a first dielectric layer; and disposing the field electrode on the section of the trench lined by the first dielectric layer.

3. The method according to claim 2, wherein:

the trench has a wall;

the disposing of the field electrode is followed by disposing a gate dielectric layer on sections of the wall of the trench and a second dielectric layer at least on the field electrode; and the providing of the gate electrode in the trench is on the second dielectric layer.

4. The method according to claim 3, wherein:

the second dielectric layer on the field electrode and the gate dielectric layer are in each case provided as oxide layers;

the oxide layer on the field electrode has a thinnest point;

the gate oxide has a thinnest point; and the disposing of the oxide layer on the field electrode and of the gate oxide includes a processing step making the thinnest point of the oxide layer on the field electrode at least as thick as the thinnest point of the gate oxide.

5. The method according to claim 4, wherein the processing step is performed at least as an HDP process including:

determining a thinnest point of the oxide layer;

depositing the oxide layer with a thinnest point substantially on the field electrode and onto uncovered sections of the first dielectric layer surrounding the field electrode; and making the thinnest point of the oxide layer at least 5% thicker than the thinnest point of the gate oxide.

6. The method according to claim 5, which further comprises depositing the oxide layer on the field electrode.

7. The method according to claim 4, wherein the processing step includes diffusion-limited depositing of silicon oxide by using tetraethyl orthosilane with a thickness on the field electrode being at least as thick as the thinnest point of the oxide at the trench walls.

8. The method according to claim 7, which further comprises following the process step with a dry oxidation process.

9. The method according to claim 8, which further comprises following the process step with a dry oxidation process.

10. The method according to claim 4, wherein the processing step includes moist oxidating in oxygen and hydrogen to oxidize a material of the field electrode at a higher rate than a material of the trench wall.

11. The method according to claim 3, which further comprises:

reducing a layer thickness $d_{ds}$ of the first dielectric layer to a layer thickness $d_{GD}$ of the gate dielectric layer in sections of a trench wall of the trench covered neither by the first auxiliary layer nor by the field electrode, during the forming of the gate dielectric layer at sections of the trench wall;

disposing the second dielectric layer exclusively on the field electrode; and forming the gate dielectric layer exclusively by the sections of the first dielectric layer having a reduced thickness.

12. The method according to claim 3, wherein the forming of the gate dielectric layer at sections of the trench wall includes:

reducing a layer thickness $d_{ds}$ of the first dielectric layer to a reduced layer thickness in sections of the trench wall that are covered neither by an auxiliary layer nor by the field electrode; and disposing the second dielectric layer on the field electrode and at least in sections of the trench wall not covered by the field electrode; and forming the gate dielectric from sections of a double layer including the first and the second dielectric layer.

13. The method according to claim 11, which further comprises:

completely removing the first dielectric layer in sections of the trench wall covered neither by an auxiliary layer nor by the field electrode; and forming the gate dielectric layer exclusively from sections of the second dielectric layer.

14. The method according to claim 3, which further comprises providing at least one of the first and the second dielectric layer in each case at least in sections as a material selected from the group consisting of a thermal oxide, a deposited oxide, a nitride, an oxynitride, and a multilayer structure.

15. The method according to claim 2, which further comprises:

reducing a layer thickness $d_{ds}$ of the first dielectric layer, in sections not covered by the field electrode;

forming a collar with the first dielectric layer; and forcing overhanging regions of the field electrode projecting in the trench beyond the collar to recede.

16. The method according to claim 15, which further comprises removing of the first dielectric layer in the sections not covered by the field electrode.

17. The method according to claim 1, which further comprises:

introducing the trench in the process layer by at least one of implantation, activation, and diffusion;

then forming both the channel zone and the source zone.

18. The method according to claim 1, which further comprises forming at least one of the channel zone and the source zone after the providing of the gate electrode.

19. The method according to claim 1, which further comprises:

defining a wall of the trench;

defining a body height of the trench at a junction of the channel zone and the drift zone in the semiconductor substrate;

forming an interspace between the field electrode and the semiconductor substrate;

after the introducing of the trench, filling the trench virtually completely with a material of the field electrode;

removing the first dielectric layer by etching from sections of the trench wall not covered by the field electrode and also from the interspace as far as the body height of the trench;

applying a second dielectric layer to the field electrode and at least to a section of the trench wall not covered by the field electrode;

subsequently filling the trench with a material of the gate electrode; and fashioning the gate electrode at a level of the channel zone beside sections of the field electrode.

20. the method according to claim 19, which further comprises filling the trench with a material of the field electrode at least to the body height.

21. The method according to claim 1, which comprises lining, in sections, the trench with a first dielectric layer by:

defining a substrate surface of the semiconductor substrate;

applying, at least in sections, the first dielectric layer, on the substrate surface patterned by the trench;

applying a first auxiliary layer on the first dielectric layer to completely fill the trench with a material of the first auxiliary layer;

removing sections of the first auxiliary layer, the trench remaining filled as far as the body height by residual sections of the first auxiliary layer;

at least reducing a layer thickness $d_{ds}$ of the frist dielectric layer in sections not covered by the residual sections of the first auxiliary layer; and removing the residual sections of the first auxiliary layer.

22. The method according to claim 21, which further comprises:

after the removing of the sections of the first auxiliary layer from the trench, providing a second, patterned auxiliary layer in the trench, above the body height, on sections of the trench provided for contact connection of the gate and field electrodes and also on adjoining regions of the substrate surface;

reducing a layer thickness of the first dielectric layer in the sections of the trench covered neither by the residual sections of the auxiliary layer nor by the second auxiliary layer; and subsequently removing the residual sections of the auxiliary layer and of the second auxiliary layer.

23. The method according to claim 21, wherein the first dielectric layer is removed.

24. The method according to claim 21, which further comprises:

after the removing of the residual sections of the first auxiliary layer, lining the trench completely with the first dielectric layer having a layer thickness $d_o$ in an upper region of the trench extending between the body height and the substrate surface and a layer thickness $d_u$ in a lower region of the trench , where $d_u > d_o$ ; and the introducing of the field electrode includes the following steps:

defining a width of the trench $d_T$;

conformally depositing the material of the field electrode with a layer thickness $d_A$, for which the following holds true:

$$d_A>(d_T/2-d_u) \text{ and } d_A<(d_T/2-d_o); \text{ and}$$

isotropicly etching-back the material of the field electrode by at least removing the material completely from the upper region of the trench.

25. The method according to claim 21, which further comprises:

using a photoresist as the material of the first auxiliary layer; and subjecting the photoresist to a postbake process before the first dielectric layer is removed in sections.

26. The method according to claim 21, which further comprises:

before the applying of the first auxiliary layer, applying an adhesion promoter.

27. The method according to claim 1, which further comprises providing a material of at least one of the field electrode and the gate electrode at least in sections with a highly conductive component.

28. The method according to claim 27, which further comprises using a silicide as the highly conductive component.

* * * * *